(12) United States Patent
Nagao et al.

(10) Patent No.: US 8,715,459 B2
(45) Date of Patent: May 6, 2014

(54) TAPE FEEDER AND METHOD OF MOUNTING TAPE ON TAPE FEEDER

(75) Inventors: Kazuhide Nagao, Fukuoka (JP); Nobuhiro Nakai, Yamanashi (JP); Yutaka Kinoshita, Yamanashi (JP)

(73) Assignee: Panasonic Corporation, Osaka (JP)

( * ) Notice: Subject to any disclaimer, the term of this patent is extended or adjusted under 35 U.S.C. 154(b) by 61 days.

(21) Appl. No.: 13/580,031

(22) PCT Filed: Feb. 3, 2012

(86) PCT No.: PCT/JP2012/000748
§ 371 (c)(1),
(2), (4) Date: Aug. 20, 2012

(87) PCT Pub. No.: WO2012/108163
PCT Pub. Date: Aug. 16, 2012

(65) Prior Publication Data
US 2012/0312856 A1    Dec. 13, 2012

(30) Foreign Application Priority Data

Feb. 8, 2011    (JP) .................................. 2011-024922

(51) Int. Cl.
*B65H 5/28*    (2006.01)
*B32B 38/10*    (2006.01)

(52) U.S. Cl.
USPC ........... 156/714; 156/764; 156/930; 156/941; 221/25; 221/79; 221/87; 414/416.05

(58) Field of Classification Search
USPC ........ 156/714, 764, 930, 931; 221/25, 72, 73, 221/79, 87; 414/411, 412, 416.01, 416.03, 414/416.05, 416.08, 425, 811
See application file for complete search history.

(56) References Cited

U.S. PATENT DOCUMENTS

| | | | |
|---|---|---|---|
| 5,053,103 A * | 10/1991 | Fritsch ........................... | 156/751 |
| 6,082,603 A * | 7/2000 | Takada et al. .................. | 226/157 |
| 6,652,706 B1 * | 11/2003 | MacNeil et al. ............... | 156/701 |
| 6,824,033 B2 * | 11/2004 | Chon ............................. | 226/128 |
| 6,877,541 B2 * | 4/2005 | Ju et al. ......................... | 156/541 |
| 2002/0014002 A1 | 2/2002 | Bergstrom | |
| 2002/0053136 A1 | 5/2002 | Bergstrom | |

(Continued)

FOREIGN PATENT DOCUMENTS

| | | |
|---|---|---|
| JP | 11-307991 A | 11/1999 |
| JP | 2002-533944 A | 10/2002 |

(Continued)

OTHER PUBLICATIONS

International Search Report for application No. PCT/JP2012/000748 dated Mar. 13, 2012.

*Primary Examiner* — Mark A Osele
(74) *Attorney, Agent, or Firm* — Pearne & Gordon LLP

(57) ABSTRACT

A positioning mechanism, which determines the relative position of a carrier tape 15 in a tape feed direction by fitting alignment pins 37 to feed holes 15*d* in a lower member 31, and a cover tape separating mechanism 50, which is provided on an upper member 32 and exposes electronic components 16 stored in component pockets 15*b* by separating a cover tape 15*e* from a base tape 15, are provided at non-interference positions that do not interfere with each other when the upper member 32 is closed to the lower member 31. Accordingly, when the cover tape 15*e* is separated from the carrier tape 15, the carrier tape 15 is aligned with the guide section 30.

3 Claims, 16 Drawing Sheets

(56) References Cited

U.S. PATENT DOCUMENTS

| | | |
|---|---|---|
| 2004/0149383 A1 | 8/2004 | Bergstrom |
| 2005/0006030 A1* | 1/2005 | Bergstrom .................. 156/584 |
| 2006/0011644 A1 | 1/2006 | Kawaguchi et al. |
| 2007/0241028 A1 | 10/2007 | Larsson et al. |
| 2010/0239401 A1 | 9/2010 | Kim |

FOREIGN PATENT DOCUMENTS

| | | |
|---|---|---|
| JP | 2004-103997 A | 4/2004 |
| JP | 2007-510296 A | 4/2007 |
| JP | 2008-277350 A | 11/2008 |
| JP | 4370058 B2 | 9/2009 |
| JP | 2010-212681 A | 9/2010 |

* cited by examiner

TAPE FEEDER AND METHOD OF MOUNTING TAPE ON TAPE FEEDER

TECHNICAL FIELD

The present invention relates to a tape feeder that is mounted on a component mounting device and supplies electronic components held on a carrier tape to a pick-up position where the electronic component is picked up by a component mounting mechanism, and a method of mounting a carrier tape on the tape feeder.

BACKGROUND ART

A tape feeder is known as a unit, which supplies electronic components, of a component mounting device. The tape feeder supplies electronic components to a pick-up position where the electronic component is picked up by a transfer head of a component mounting mechanism by intermittently feeding a carrier tape that holds electronic components. While the upper portion of the carrier tape is covered with a cover tape and the carrier tape is guided along a tape travel path formed in a body portion of the tape feeder in the vicinity of the pick-up position, the carrier tape is pitch-fed by a tape feed mechanism. Further, the electronic components are picked up at the pick-up position through a component take-out opening portion, which is formed at the tape guide, by the transfer head of the component mounting mechanism.

The carrier tape, which holds the electronic components, is supplied generally while being wound on a supply reel. When a new carrier tape is to be mounted, the carrier tape drawn out from the supply reel is inserted from a tape insertion portion and is subjected to a tape mounting work setting the carrier tape on the lower surface of the cover member at the pick-up position. This tape mounting work requires a complicated operation that sets the carrier tape on the body portion by pressing the carrier tape against the tape travel path from above by a pressing member while feed holes of the carrier tape are correctly engaged with feed pins of a sprocket of the tape feed mechanism.

For this reason, in the past, in order to make the tape mounting work easily, there has been known a tape feeder having the configuration where a tape guide guiding a carrier tape is detachably mounted on the body portion in the vicinity of the pick-up position and is provided with separating members partially separating a cover tape from the carrier tape (for example, see PTL 1). According to this configuration, it is possible to set the carrier tape on the tape guide when the tape guide is detached from the body portion. Accordingly, there is an advantage that the workability of a tape mounting work can be improved.

CITATION LIST

Patent Literature

[PTL 1] Japanese Patent No. 4370058

SUMMARY OF INVENTION

Technical Problem

As in the above-mentioned configuration, a separating mechanism, which is provided with separating members separating a cover tape from the carrier tape, and a positioning mechanism, which correctly aligns the carrier tape with the tape guide, are required in the configuration where a carrier tape is set on a tape guide detachably mounted on a body portion. Further, since the separating mechanism and the positioning mechanism are assembled in one tape guide, it is expected that the separating mechanism and the positioning mechanism are disposed so that the positions of the separating mechanism and the positioning mechanism do not interfere with each other and the carrier tape can be easily and accurately aligned with the tape guide when the cover tape is separated from the carrier tape.

Accordingly, an object of the invention is to provide a tape feeder that can easily and accurately align a carrier tape with a tape guide in the configuration where a separating mechanism for a cover tape and a positioning mechanism for the carrier tape are assembled in the tape guide, and a method of mounting a tape on the tape feeder.

Solution to Problem

A tape feeder of this invention that sequentially supplies electronic components to a pick-up position where the electronic component is picked up by a transfer head by pitch-feeding a carrier tape that holds the electronic component in component storage recesses, the tape feeder comprising:

a body portion in which a tape travel path guiding the carrier tape is formed, the carrier tape including a base tape on which the recesses are formed and a cover tape adhering to an upper surface of the base tape so as to cover the recesses;

a tape feed mechanism that is provided in the body portion and pitch-feeds the carrier tape at a predetermined pitch by intermittently rotating a sprocket when feed pins of the sprocket are engaged with feed holes formed on the base tape; and a guide section that guides the carrier tape fed by the tape feed mechanism in a predetermined range including the pick-up position on the body portion, and is detachably mounted on the body portion, wherein the guide section includes
a lower member that guides a lower surface of the carrier tape and is provided with an attachment/detachment mechanism that is attached to and detached from the body portion,
an upper member that guides the width direction of the carrier tape and presses the carrier tape from above by a guide surface to guide the upper surface of the carrier tape, and
an opening and closing mechanism that opens and closes the upper member with respect to the lower member,
a positioning mechanism that determines the relative positions of the carrier tape and the guide section on the lower member in a tape feed direction by fitting alignment pins to feed holes of the carrier tape, and
a cover tape separating mechanism that is provided on the upper member, and exposes the electronic components stored in the recesses by separating the cover tape from one side portion of the base tape on which the recesses are formed, and
the positioning mechanism and the cover tape separating mechanism are provided at non-interference positions that do not interfere with each other when the upper member is closed to the lower member.

A method of this invention for mounting a carrier tape on a guide section of a tape feeder, the tape feeder including a body portion in which a tape travel path guiding the carrier tape is formed, the carrier tape including a base tape on which the recesses are formed and a cover tape adhering to an upper surface of the base tape so as to cover the recesses, a tape feed mechanism that is provided in the body portion and pitch-feeds the carrier tape at a predetermined pitch by intermittently rotating a sprocket when feed pins of the sprocket are engaged with feed holes formed on the base tape, and a guide section that guides the carrier tape fed by the tape feed mechanism in a predetermined range including the pick-up position on the body portion, and is detachably mounted on the body portion, the guide section including a lower member that guides a lower surface of the carrier tape and is provided with an attachment/detachment mechanism that is attached to and detached from the body portion, an upper member that guides the width direction of the carrier tape and presses the carrier tape from above by a guide surface to guide the upper surface of the carrier tape, an opening and closing mechanism that opens and closes the upper member with respect to the lower member, a positioning mechanism that determines the relative positions of the carrier tape and the guide section on the lower member in a tape feed direction by fitting alignment pins to feed holes of the carrier tape, and a cover tape separating mechanism that is provided on the upper member, and exposes the electronic components stored in the recesses by separating the cover tape from one side portion of the base tape on which the recesses are formed, and the tape feeder sequentially supplying the exposed electronic components to a pick-up position where the electronic component is picked up by a transfer head by pitch-feeding the carrier tape that holds the electronic component in the recesses, the method comprising:

separating one side portion of the cover tape from the base tape of the introduced carrier tape by the cover tape separating mechanism and folding one side portion of the cover tape toward the other side portion when the carrier tape is introduced into the upper member; and closing the upper member to the lower member so that the positioning mechanism and the cover tape separating mechanism do not interfere with each other.

Advantageous Effects of Invention

According to the invention, a positioning mechanism, which determines the relative positions of a carrier tape and a guide section on a lower member in a tape feed direction, and a cover tape separating mechanism, which is provided on an upper member and exposes electronic components stored in recesses by separating a cover tape from a base tape, are provided at non-interference positions that do not interfere with each other when the upper member is closed to the lower member. Accordingly, when the cover tape is separated from the carrier tape, it is possible to easily and accurately align the carrier tape with a tape guide.

DESCRIPTION OF EMBODIMENTS

Next, embodiments of the invention will be described with reference to the drawings. First, the configuration of a component mounting device 1, which mounts electronic components on a substrate, will be described with reference to FIGS. 1 and 2. The component mounting device 1 has a function of mounting electronic components such as semiconductor chips on a substrate, and FIG. 2 partially shows a cross-section taken along line A-A of FIG. 1.

Figure 1:
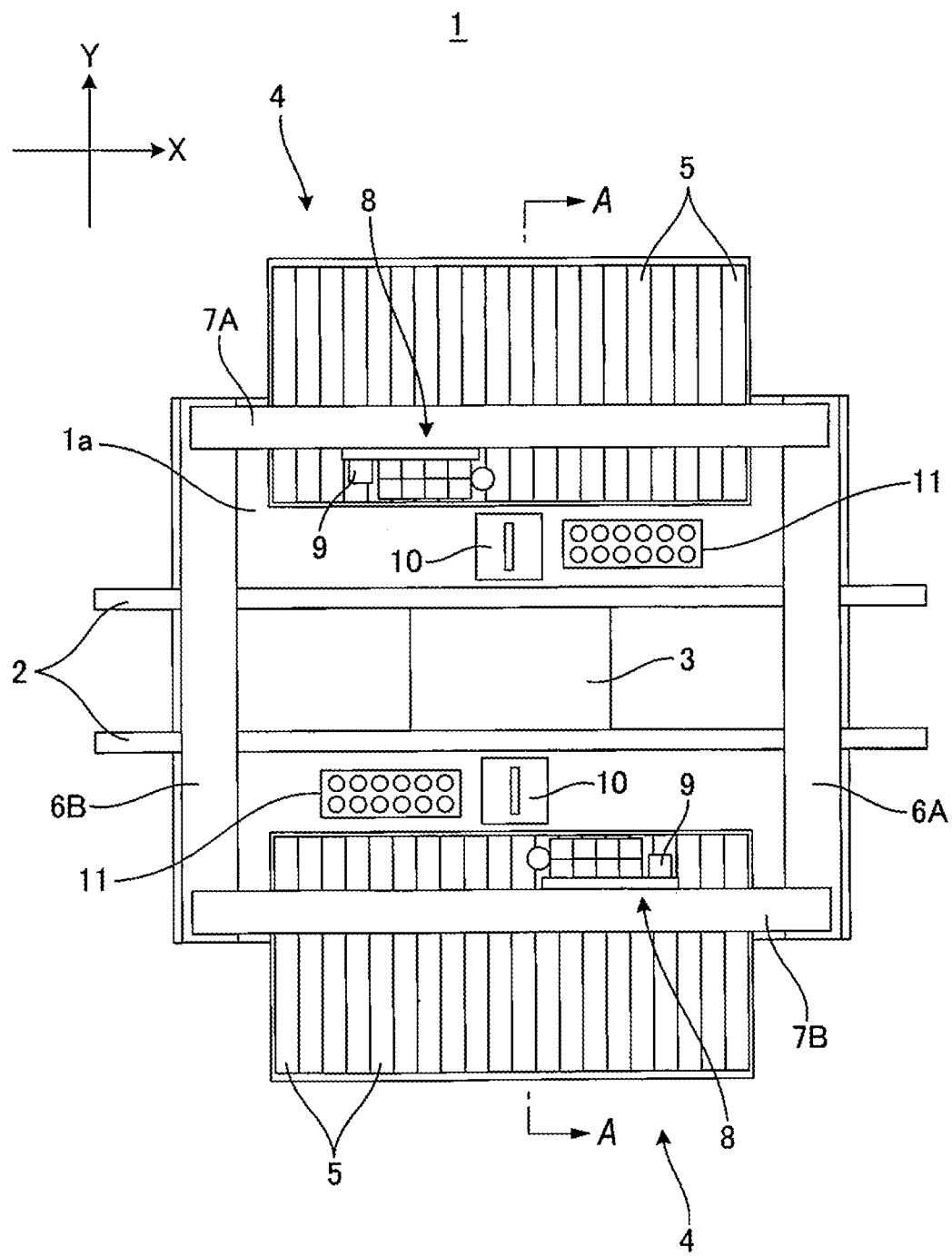
FIG. 1 is a plan view of a component mounting device of an embodiment of the invention.

In FIG. 1, a substrate transfer mechanism 2 is disposed along an X direction (substrate transfer direction) in the middle of a base 1a. The substrate transfer mechanism 2 transfers a substrate 3, which is transferred from the upstream side, and positions the substrate 3 on a mounting stage that is set to perform a component mounting work. Component supply units 4 are disposed on both sides of the substrate transfer mechanism 2, and a plurality of tape feeders 5 are arranged side by side in each of the component supply units 4. The tape feeders 5 supply electronic components to pick-up positions, where the electronic components are picked up by suction nozzles of transfer heads to be described below, by pitch-feeding carrier tapes that hold electronic components.

Y-axis tables 6A and 6B are provided on both end portions of the upper surface of the base 1a, and two X-axis tables 7A and 7B are installed on the Y-axis tables 6A and 6B. The Y-axis table 6A is driven, so that the X-axis table 7A is horizontally moved in a Y direction. The Y-axis table 6B is driven, so that the X-axis table 7B is horizontally moved in the Y direction. A transfer head 8 and a substrate recognition camera 9, which is moved integrally with the transfer head 8, are mounted on each of the X-axis tables 7A and 7B.

The Y-axis table 6A, the X-axis table 7A, the Y-axis table 6B, and the X-axis table 7B are driven in combination, so that the transfer heads 8 are horizontally moved. Then, the transfer heads 8 pick up electronic components from the respective component supply units 4 by the suction nozzles 8a (see FIG. 2), and mount the electronic components on the substrate 3 that is positioned by the substrate transfer mechanism 2. The Y-axis table 6A, the X-axis table 7A, the Y-axis table 6B, and the X-axis table 7B form head moving mechanisms that move the transfer heads 8.

The substrate recognition cameras 9, which are moved above the substrate 3 together with the transfer heads 8, take images of the substrate 3 and recognize the substrate 3. Further, component recognition cameras 10 are provided on paths that reach the substrate transfer mechanism 2 from the component supply units 4. When the transfer heads 8 having taken out the electronic components from the component supply units 4 are moved to the substrate 3 positioned on the mounting stage, the transfer heads 8 move the electronic components, which are held by the suction nozzles 8a, in the X direction above the component recognition cameras 10. Accordingly, the component recognition cameras 10 take images of the electronic components that are held by the suction nozzles 8a. Furthermore, image results are subjected to recognition processing by a recognition device (not shown), so that the positions of the electronic components held by the suction nozzles 8a are recognized and the kinds of the electronic components are identified. Nozzle holders 11 store several kinds of suction nozzles 8a in a predetermined attitude. The transfer heads 8 access the nozzle holders 11 and perform a nozzle replacement operation, so that the nozzles are replaced according to the kinds of electronic components, that is, objects to be transferred by the transfer heads 8.

Figure 2:
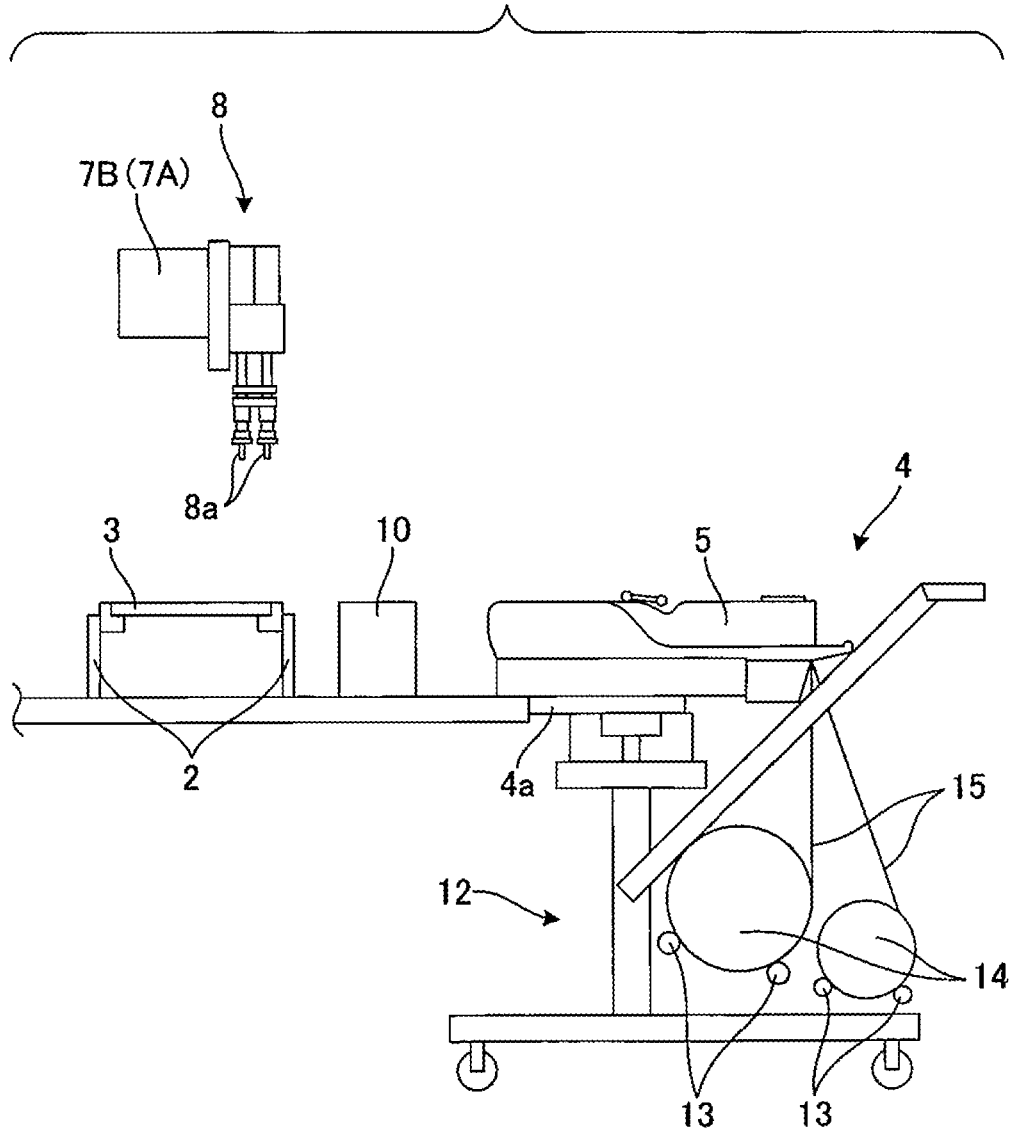
FIG. 2 is a partial cross-sectional view of the component mounting device of the embodiment of the invention.

The configuration of the component supply unit 4 will be described. As shown in FIG. 2, the component supply unit 4 is provided with a feeder base 4a on which the plurality of tape feeders 5 are mounted. The tape feeders 5 are disposed in the component supply unit 4 by a carriage 12 for mounting feeders, and the carriage 12 are provided with reel holders 13 holding tape reels 14 that store carrier tapes 15 having been wound. The reel holders 13 include holding rollers that hold the tape reels 14 so as to allow the tape reels 14 to be rotatable. Accordingly, it is possible to draw out the carrier tapes 15 by rotating the tape reels 14 that are disposed in the component supply unit 4.

Figure 3:
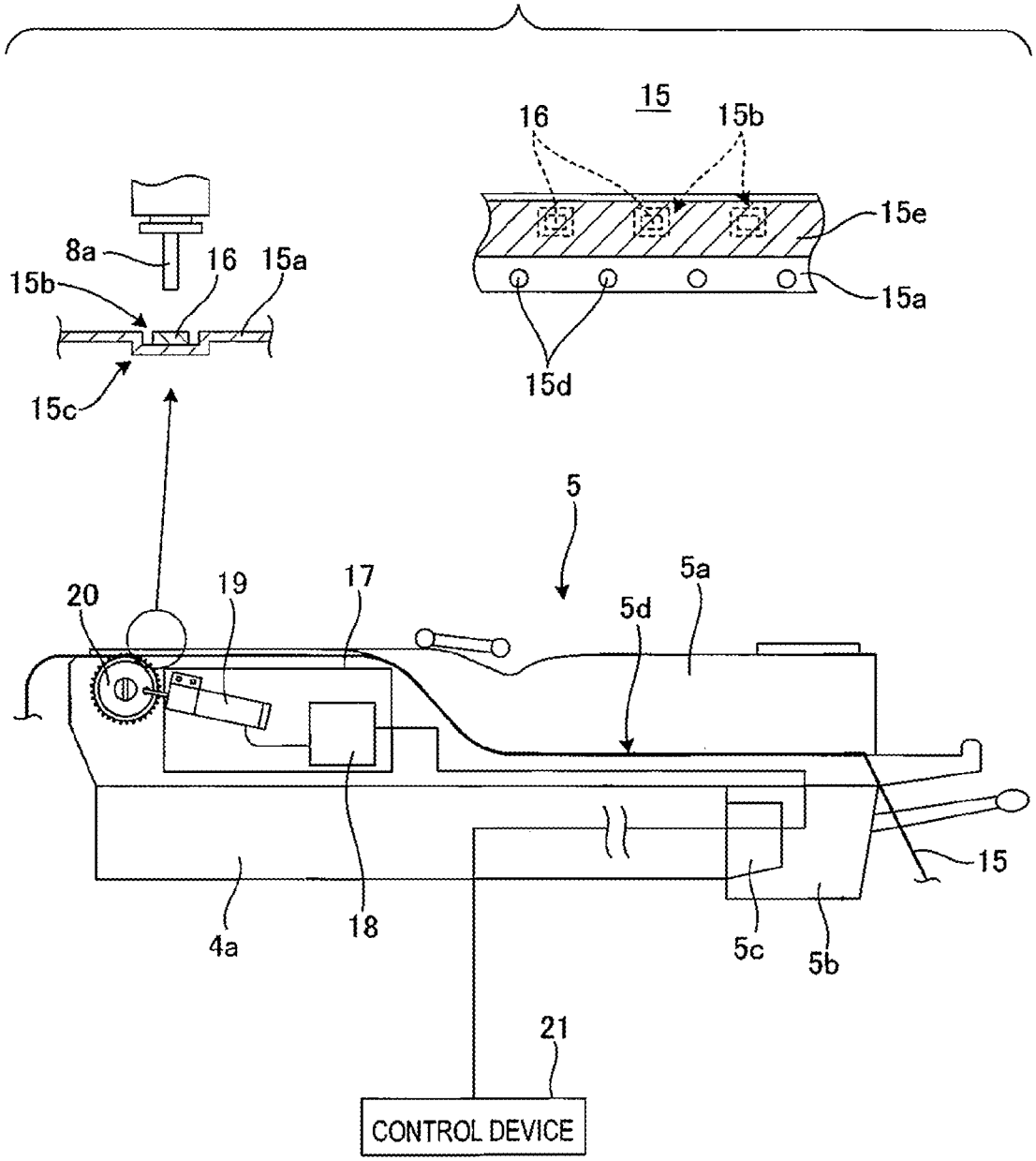
FIG. 3 is a view illustrating the configuration of a tape feeder according to the embodiment of the invention.

Next, the configuration of function of the tape feeder 5 will be described with reference to FIG. 3. As shown in FIG. 3, the tape feeder 5 includes a body portion 5a and a mounting portion 5b that protrudes downward from the lower surface of the body portion 5a. When the tape feeder 5 is mounted so that the lower surface of the body portion 5a follows the feeder base 4a, a connector 5c formed at the mounting portion 5b is fitted to the feeder base 4a. Accordingly, the tape feeder 5 is fixed and mounted to the component supply unit 4, and the tape feeder 5 is electrically connected to a control device 21 of the component mounting device 1.

A tape travel path 5d, which guides the carrier tape 15 drawn out from the tape reel 14 and inserted into the body portion 5a, is continuously formed in the body portion 5a from the rear end portion of the body portion 5a to the front end portion of the body portion 5a. The carrier tape 15 is formed so that component pockets 15b, which are component storage recesses in which electronic components 16 are stored and held, and feed holes 15d used to pitch-feed the carrier tape 15 are formed at a predetermined pitch on a base tape 15a forming a tape body. Embossed portions 15c, which protrude downward from the base tape 15a, are formed on the lower surfaces of the component pockets 15b. A cover tape 15e adheres to the upper surface of the base tape 15a so as to cover the component pockets 15b for the prevention of the falling-off of the electronic components 16 from the component pockets 15b.

A tape feed section 17, which pitch-feeds the carrier tape 15, is built in the body portion 5a. The tape feed section 17 includes a feed motor 19 that rotationally drives a sprocket 20 provided at the front end portion of the tape travel path 5d, and a feeder control section 18 that controls the feed motor 19. When the tape feeder 5 is mounted on the feeder base 4a, the feeder control section 18 is connected to the control device 21.

Figure 16:
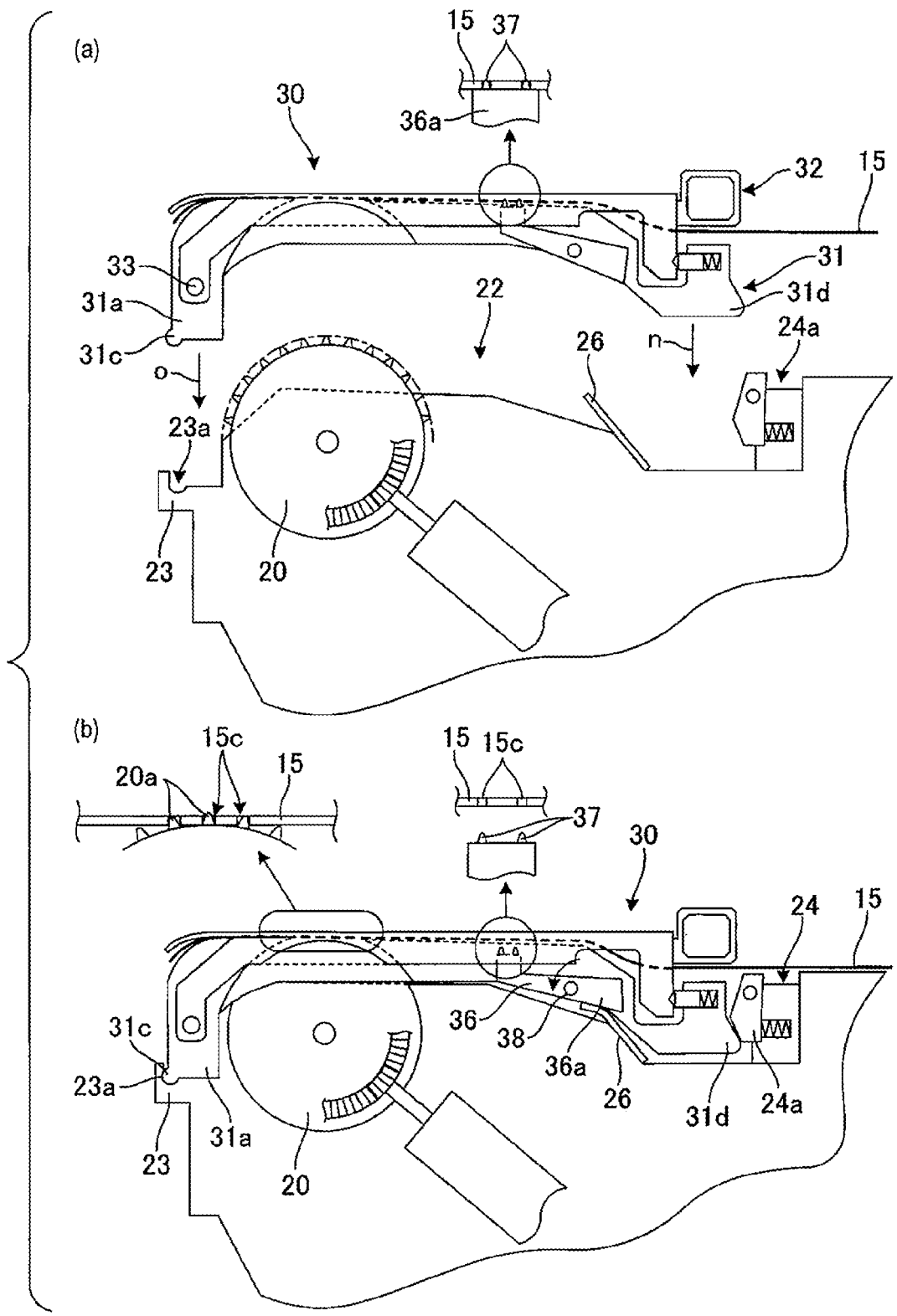
FIGS. 16A to 16B are views illustrating processes of the method of mounting a tape on the tape feeder according to the embodiment of the invention.

Feed pins 20a (see FIG. 16B), which are fitted to the feed holes 15d, are provided on the sprocket 20 at a constant pitch. Accordingly, when the feed motor 19 is driven in the state where these feed pins are engaged with the feed holes 15d, the sprocket 20 is intermittently rotated by a bevel gear 25 fixed to a rotating shaft 19a. Therefore, the carrier tape 15 is pitch-fed to the downstream side (the left side in FIG. 3). The sprocket 20 and the feed motor 19 form a tape feed mechanism that is provided in the body portion 5a and pitch-feeds the carrier tape 15 at a predetermined pitch by intermittently rotating the sprocket 20 when the feed pins 20a of the sprocket 20 are engaged with the feed holes 15d.

The front side of the sprocket 20 is positioned at a pick-up position where the electronic component 16 stored in the component pocket 15b is sucked and taken out by the suction nozzles 8a of the transfer head 8. The carrier tape 15, which is fed along the tape travel path 5d by the above-mentioned tape feed mechanism, is guided by a guide section 30 to be described below in a predetermined range including the above-mentioned pick-up position, that is, in a range that is required to guide the carrier tape 15 to a pick-up position where the electronic component is picked up by the suction nozzles 8a and to correctly engage the feed holes 15d with the feed pins 20a. Further, an adhering surface, which adheres to the base tape 15a, of the cover tape 15e adhering to the base tape 15a is partially separated by a tape separating mechanism that is assembled in the guide section 30. Accordingly, the electronic component 16 stored in the component pocket 15b is exposed.

Figure 4:
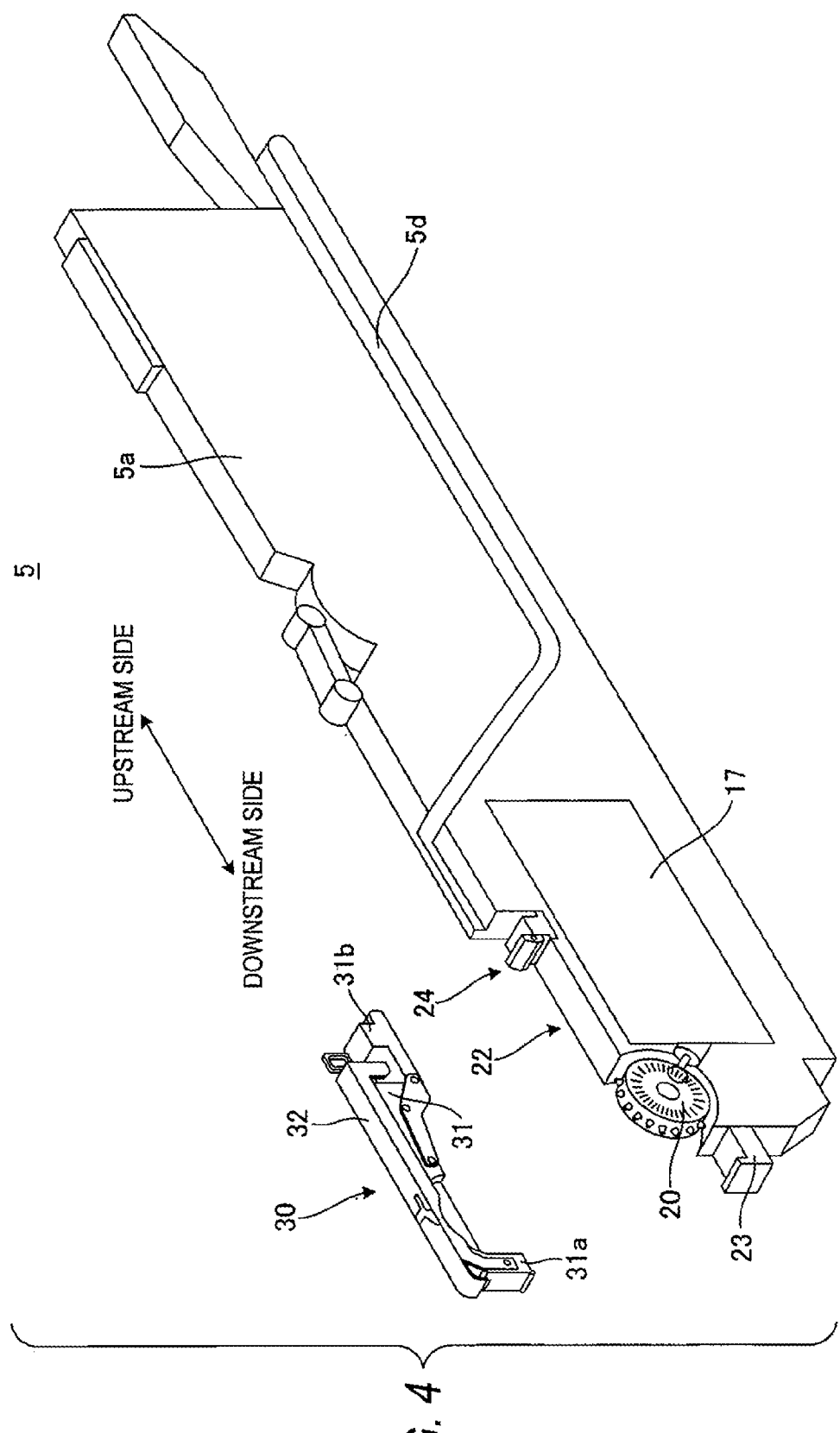
FIG. 4 is a perspective view of the tape feeder according to the embodiment of the invention.

As shown in FIG. 4, a predetermined range of a front end portion (the downstream side in a tape feed direction) of the body portion 5a forms a guide mounting portion 22 to and from which the guide section 30 is attached and detached. The guide section 30 includes a lower member 31 and an upper member 32. When a downstream mounting portion 31a and an upstream mounting portion 31b formed at the lower member 31 are engaged with and fixed to a downstream fitting portion 23 and an upstream locking section 24, respectively, the guide section 30 is mounted on the guide mounting portion 22. When a reverse operation is performed, the guide section 30 is detached from the guide mounting portion 22.

Figure 5:
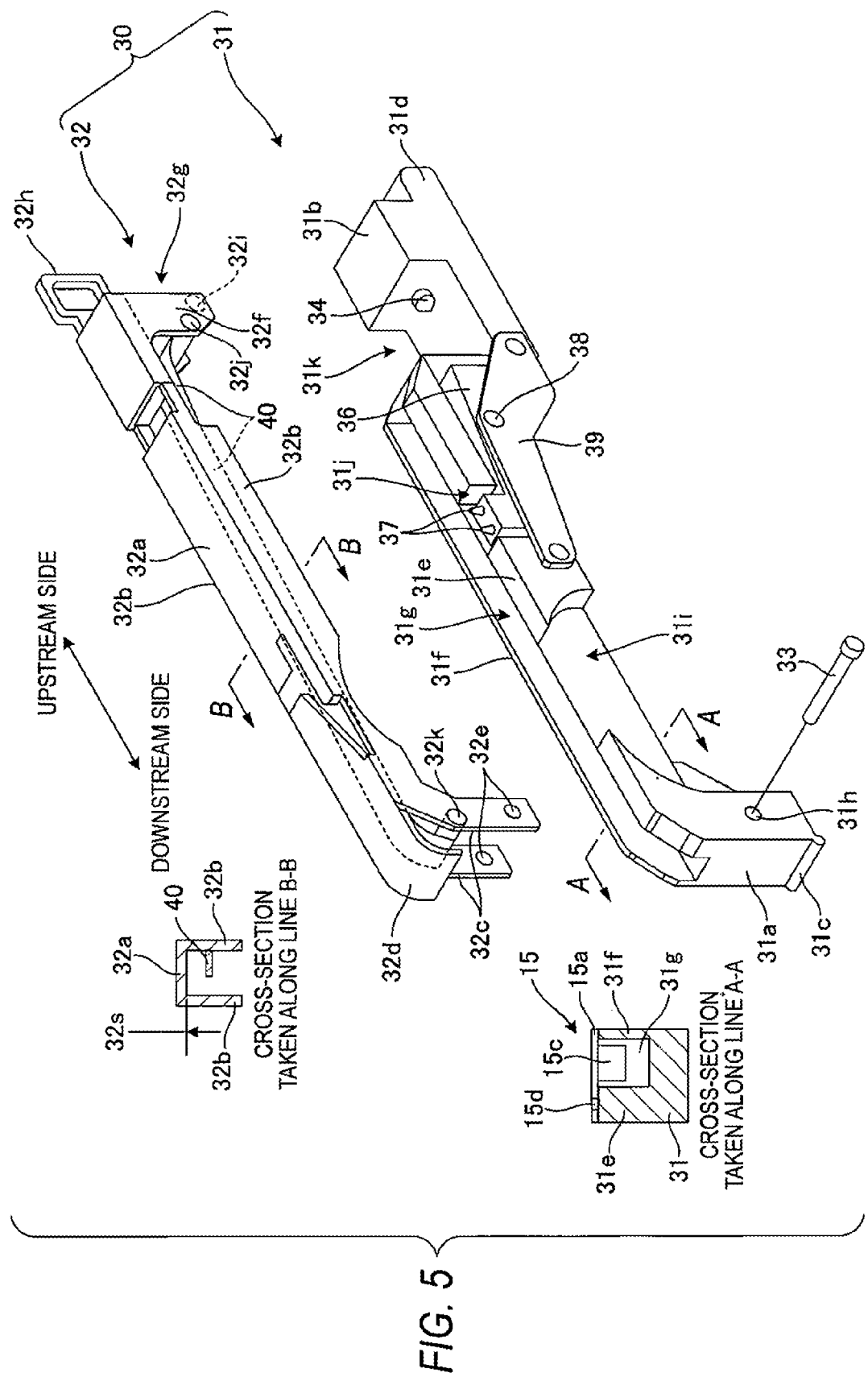
FIG. 5 is a view illustrating the configuration of a guide section that is mounted on the tape feeder according to the embodiment of the invention.
Figure 6:
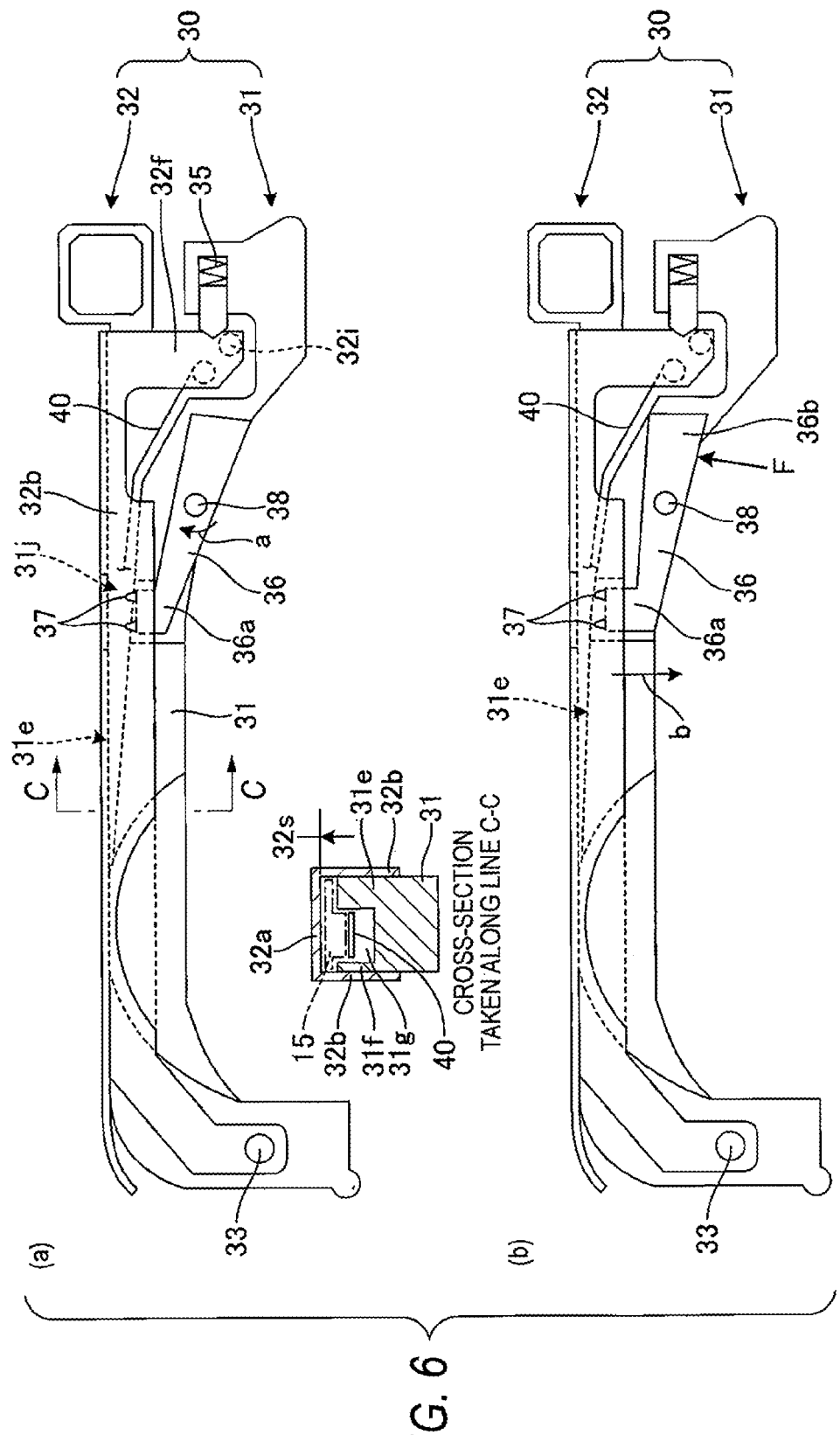
FIGS. 6A and 6B are views illustrating a function of the guide section that is mounted on the tape feeder according to the embodiment of the invention.

The respective portions forming the guide section 30 and the functions of the respective portions will be described below with reference to FIGS. 5 to 8. As shown in FIG. 5, the guide section 30 includes the lower member 31 and the upper member 32. As shown in the cross-section taken along line A-A, the lower member 31 is formed so that a groove portion 31g is formed on the upper surface of a longitudinal member having a rectangular cross-section and forming a body of the lower member 31. The lower member 31 has a function of supporting the carrier tape 15 from the lower side by tape support portions 31e and 31f that are formed on both sides of the groove portion 31g. When the carrier tape 15 is placed on the lower member 31, the feed of the tape is guided while the embossed portions 15c are fitted into the groove portion 31g, a range of the base tape where the feed holes 15d are formed is supported by the tape support portion 31e, and an opposite end portion of the base tape 15a is supported by the tape support portion 31f. Even in the case of a flat plate-like paper tape or the like without the embossed portions 15c, likewise, the carrier tape 15 is supported by the tape support portions 31e and 31f.

The downstream mounting portion 31a extends downward from the downstream (left in FIG. 5) end portion of the lower member 31, and a fitting portion 31c is formed at the lower end portion of the downstream mounting portion 31a in a shape where the fitting portion 31c is fitted to a fitting recess 23a (see FIG. 8) of the downstream fitting portion 23. The upstream mounting portion 31b extends from the upstream (left in FIG. 5) portion of the lower member 31. A locked portion 31d is formed at an end portion of the lower member 31 in a shape where the locked portion 31d can be locked by a locking member 24a of the upstream locking section 24. When the guide section 30 is mounted on the guide mounting portion 22 of the tape feeder 5, the locked portion 31d is locked by the locking member 24a in the state where the fitting portion 31c is fitted to the fitting recess 23a of the downstream fitting portion 23.

Further, when the guide section 30 is separated from the guide mounting portion 22 of the tape feeder 5, the fitting portion 31c is detached from the fitting recess 23a in the state where the locking of the locked portion 31d performed by the locking member 24a is released. Accordingly, the fitting portion 31c and the locked portion 31d, which are formed at the lower member 31, form an attachment/detachment mechanism that attaches and detaches the lower member 31 to and from the guide mounting portion 22. That is, in the configuration of the guide section 30 of this embodiment, the lower member 31 has a function of supporting the lower surface of the carrier tape 15 and is provided with the attachment/detachment mechanism that is attached to and detached from the guide mounting portion 22.

The shape of the upper member 32 will be described. As shown in the cross-section taken along line B-B of FIG. 5, the upper member 32 is mainly formed of a longitudinal member having a rectangular frame-shaped cross-section opened downward, that is, a cross-section where side surface portions 32b extend downward from both side ends of a horizontal upper surface portion 32a. The back surface of the upper surface portion 32a forms a guide surface 32s that guides the upper surface of the carrier tape 15. Pivot plates 32c, which extend downward from the side surface portions 32b, and an upper cover portion 32d, which is curved downward from the upper surface portion 32a to cover the upper portions of the pivot plates 32c, are formed at the downstream end portion of the upper member 32. Shaft holes 32e are formed in the pivot plates 32c. Accordingly, when the upper member 32 is connected to the lower member 31, a pivot pin 33 fitted to a pivot hole 31h formed in the downstream mounting portion 31a is inserted into the shaft holes 32e and the upper member 32 is pivotally supported by the pivot pin 33. Therefore, the upper member 32 is connected to the lower member 31 so as to be freely opened and closed.

That is, the pivot hole 31h formed in the downstream mounting portion 31a, the shaft holes 32e formed in the pivot plates 32c, and the pivot pin 33 form an opening and closing mechanism that opens and closes the upper member 32 with respect to the lower member 31. That is, the opening and closing mechanism opens and closes the upper member 32 with respect to the lower member 31 by turning the upper member 32 around a pivot point (the pivot pin 33 fitted to the pivot hole 31h) that is provided at the lower member 31 on the downstream side in the tape feed direction.

A lower guide member 40, of which one end portion is fixed to bent portions 32f by a fixing member 32j and the other end portion is fixed to the pivot plates 32c by a fixing member 32k, is provided in the upper member 32 over substantially the entire length of the upper member 32. The lower guide member 40 is positioned below the upper surface portion 32a in the cross-section taken along line B-B, and corresponds to the position of the groove portion 31g of the lower member 31. The lower guide member 40 is a resilient plate member such as a leaf spring, and has a function of guiding the carrier tape 15 from below when the carrier tape 15 is mounted in the upper member 32 in the state where the upper member 32 is opened from the lower member 31 by the above-mentioned opening and closing mechanism.

Further, when the upper member 32 is closed to the lower member 31, that is, when the upper member 32 is turned around the pivot pin 33 and covers the upper portion of the lower member 31 (see FIGS. 6A and 6B), the side surface portions 32b of the upper member 32 are positioned on the sides of the tape support portions 31e and 31f and guide the width direction of the carrier tape 15 and the guide surface 32s provided on the back surface of the upper surface portion 32a is positioned on the upper surface of the carrier tape 15 fed on the lower member 31 and presses the carrier tape 15 from above to guide the upper surface of the carrier tape (see the cross-section taken along line C-C of FIG. 6B). That is, the upper member 32 has a function of guiding the width direction of the carrier tape 15 and a function of pressing the carrier tape 15 from above by the guide surface 32s to guide the upper surface of the carrier tape 15.

The bent portions 32f bent and extend downward from the side surface portions 32b, are formed at the upstream portion of the upper member 32. A space between the two bent portions 32f forms a tape insertion opening 32g which is opened to the upstream side and through which the carrier tape 15 is introduced. When the carrier tape 15 is set in the guide section 30, the end portion of the carrier tape 15 is inserted to the guide section from the tape insertion opening 32g and the carrier tape 15 is introduced to the downstream side in the upper member 32 while the carrier tape 15 is guided by the lower guide member 40 provided in the upper member 32. That is, the tape insertion opening 32g is formed on the upstream side of the upper member 32 in the tape feed direction and forms a tape introducing portion through which the carrier tape 15 is introduced into the upper member 32.

In addition, a locking pin 32i for locking is provided at the lower end portions of the bent portions 32f, and the bent portions 32f are fitted to a locking recess 31k formed at the downstream portion of the upstream mounting portion 31b when the upper member 32 is closed to the lower member 31. A pin-like locking member 34, which is pushed to the downstream side in the horizontal direction by a compression spring member 35, is mounted at the upstream mounting portion 31b so as to protrude into the locking recess 31k. When the upper member 32 is closed to the lower member 31, the locking member 34 locks the locking pin 32i. Accordingly, the position of the upper member 32 is fixed. A grip ring 32h is formed at the upstream end portion of the upper member 32. Accordingly, a worker grips the grip ring 32h and pushes down and pulls up the grip ring 32h at the time of the operations for opening and closing the upper member 32.

An escape portion 31i is formed in a range of the tape support portion 31e, which interferes with the sprocket 20 when the guide section 30 is mounted on the guide mounting portion 22, according to the shape of the sprocket 20. Moreover, a cutout portion 31*j* in which a positioning mechanism to be described below is assembled is formed at the tape support portion 31*e*. The cutout portion 31*j* is formed by partially cutting out a part of the upper surface of the tape support portion 31*e*, and is formed in a range that stores an alignment member 36 of which a pin mounting portion 36*a* is formed by bending one end portion of a long thin member upward. The alignment member 36 is pivotally supported on the lower member 31 by a pivot pin 38, and one end portion of the pivot pin 38 is supported by a support bracket 39 that is fixed to the side surface of the tape support portion 31*e*. Meanwhile, the support bracket 39 is not shown in other drawings except for FIG. 5. A pair of alignment pins 37 is provided on the upper surface of the pin mounting portion 36*a* at an interval corresponding to the pitch of the feed holes 15*d* of the carrier tape 15. Accordingly, the alignment pins 37 can be exposed to the upper surface of the tape support portion 31*e* through the cutout portion 31*j*.

Next, the configuration of the guide section 30 of which the upper member 32 is closed to the lower member 31 and the functions of the respective portions will be described with reference to FIGS. 6A, 6B, and 7. FIG. 6A shows a state where the upper member 32 is turned around the pivot pin 33 and closed to the lower member 31. In this case, the locking pin 32*i* provided at the bent portions 32*f* is locked by the locking member 34, so that the upper member 32 is fixed. In this state, the alignment member 36 is pushed around the pivot pin 38 in a counterclockwise direction (arrow a), so that the alignment pins 37 protrude from the upper surface of the tape support portion 31*e* through the cutout portion 31*j*.

Accordingly, when the guide section 30 is detached from, the alignment pins 37, which are always positioned at the fixing position, are fitted to the feed holes 15*d* of the carrier tape 15, which is introduced into the upper member 32 and interposed between the upper and lower member 32 and 31. Therefore, the relative positions of the guide section 30 and the carrier tape 15 in the tape feed direction are determined. Here, the positions of the alignment pins 37 are set to positions where the feed holes 15*d* of the carrier tape 15 are correctly engaged with the feed pins 20*a* of the sprocket 20 in this positioning state. Accordingly, when the guide section 30 in which the carrier tape 15 is positioned by the alignment pins 37 is mounted on and fixed to the guide mounting portion 22, the carrier tape 15 is set to a position where the feed pins 20*a* of the sprocket 20 are engaged with the feed holes 15*d* without requiring other position adjusting operations.

FIG. 6B shows a state where an external force F for releasing fitting is applied to an opposite end portion 36*b* opposite to the pin mounting portion 36*a* from below in the state shown in FIG. 6A. That is, the alignment member 36 is turned against a pushing force around the pivot pin 38 in a clockwise direction by this external force F, so that the pin mounting portion 36*a* is moved down (arrow b) together with the alignment pins 37 and the alignment pins retreat from the upper surface of the tape support portion 31*e*. In this embodiment, a leaf spring member 26 (see FIG. 8) is provided on the guide mounting portion 22 at a position corresponding to the opposite end portion 36*b* opposite to the pin mounting portion 36*a*. Accordingly, when the guide section 30 is mounted on the guide mounting portion 22, the leaf spring member 26 applies an upward external force to the alignment member 36 (see FIG. 6B), so that the alignment pins 37 are separated from the feed holes 15*d* of the carrier tape 15. Therefore, the pitch-feeding of the carrier tape 15 is not obstructed by the alignment pins 37.

In the above-mentioned configuration, the alignment member 36 pivotally supported by the pivot pin 38 and the alignment pins 37 provided on the pin mounting portion 36*a* form a positioning mechanism that determines the relative positions of the carrier tape 15 and the guide section 30 in the tape feed direction by making the alignment pins 37 be fitted to the feed holes 15*d* of the carrier tape 15 in the guide section 30. Further, the positioning mechanism is formed in this embodiment so that the alignment pins 37 are provided on the lower member 31, and includes a fitting releasing mechanism that separates the alignment pins 37 from the feed holes 15*d* when the lower member 31 is mounted on the guide mounting portion 22.

Meanwhile, a configuration example that applies a turning force to the alignment member 36 by the leaf spring member 26 has been described in this embodiment as the fitting releasing mechanism. However, as long as the alignment member 36 is operated so that the pin mounting portion 36*a* is moved down, other mechanisms such as a compression spring may be used. Moreover, a configuration example where the positioning mechanism is provided on the lower member 31 has been described in this embodiment. However, as long as the mechanism has a function of determining the relative positions of the carrier tape 15 and the guide section 30 in the tape feed direction, the positioning mechanism may be provided on the upper member 32.

Figure 7:
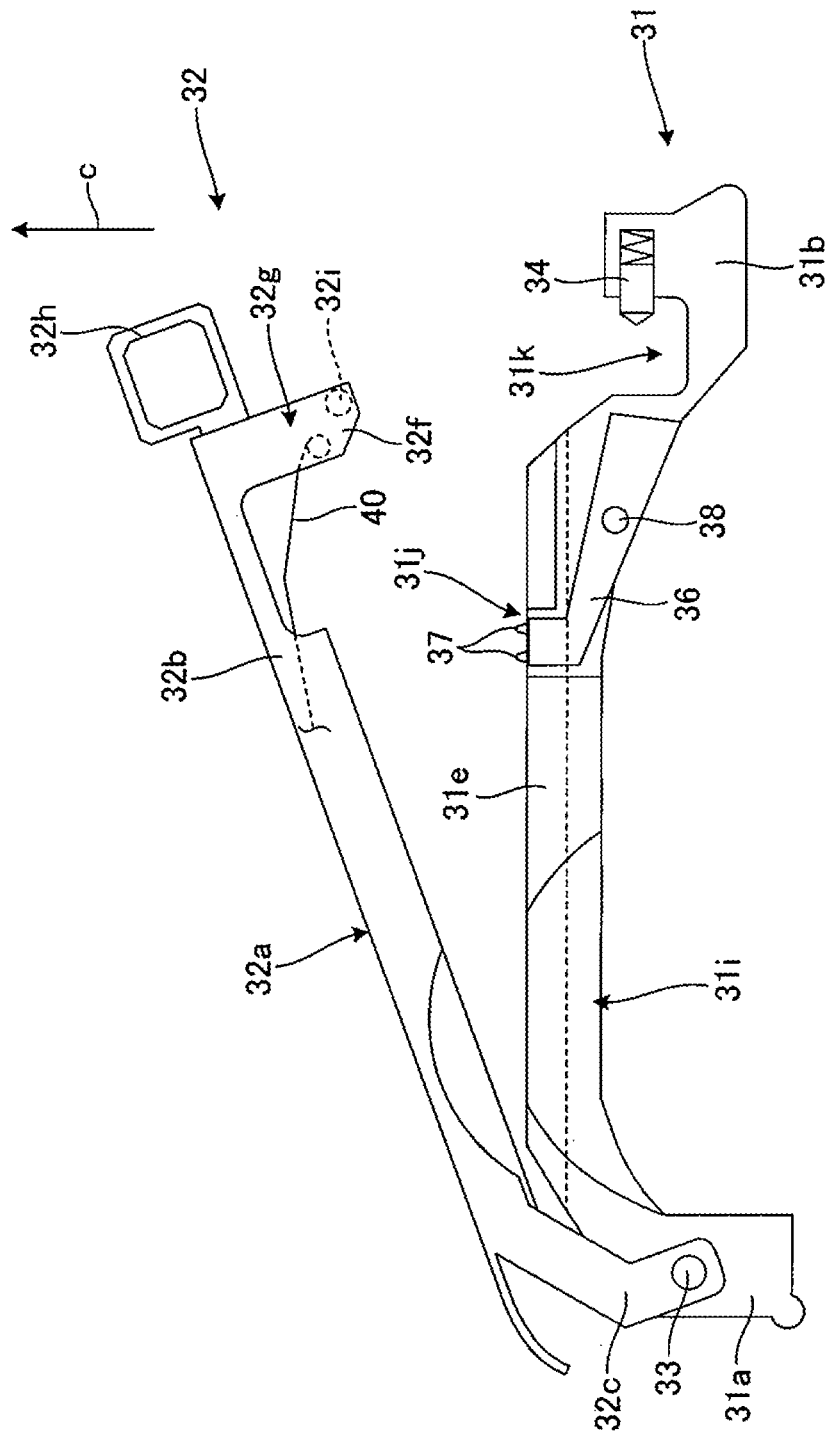
FIG. 7 is a view illustrating a function of the guide section that is mounted on the tape feeder according to the embodiment of the invention.

FIG. 7 shows a state where the grip ring 32*h* is pulled up (arrow c), the upper member 32 is turned around the pivot pin 33, and the guide section 30 is opened. A new carrier tape 15 is set in this state. In this state, the alignment pins 37 protrude from the upper surface of the tape support portion 31*e* through the cutout portion 31*j* and the carrier tape 15 can be aligned. When the upper member 32 is closed and the alignment pins 37 are fitted to the feed holes 15*d*, the carrier tape 15 introduced into the upper member 32 is positioned relative to the guide section 30 in the tape feed direction.

Figure 8:
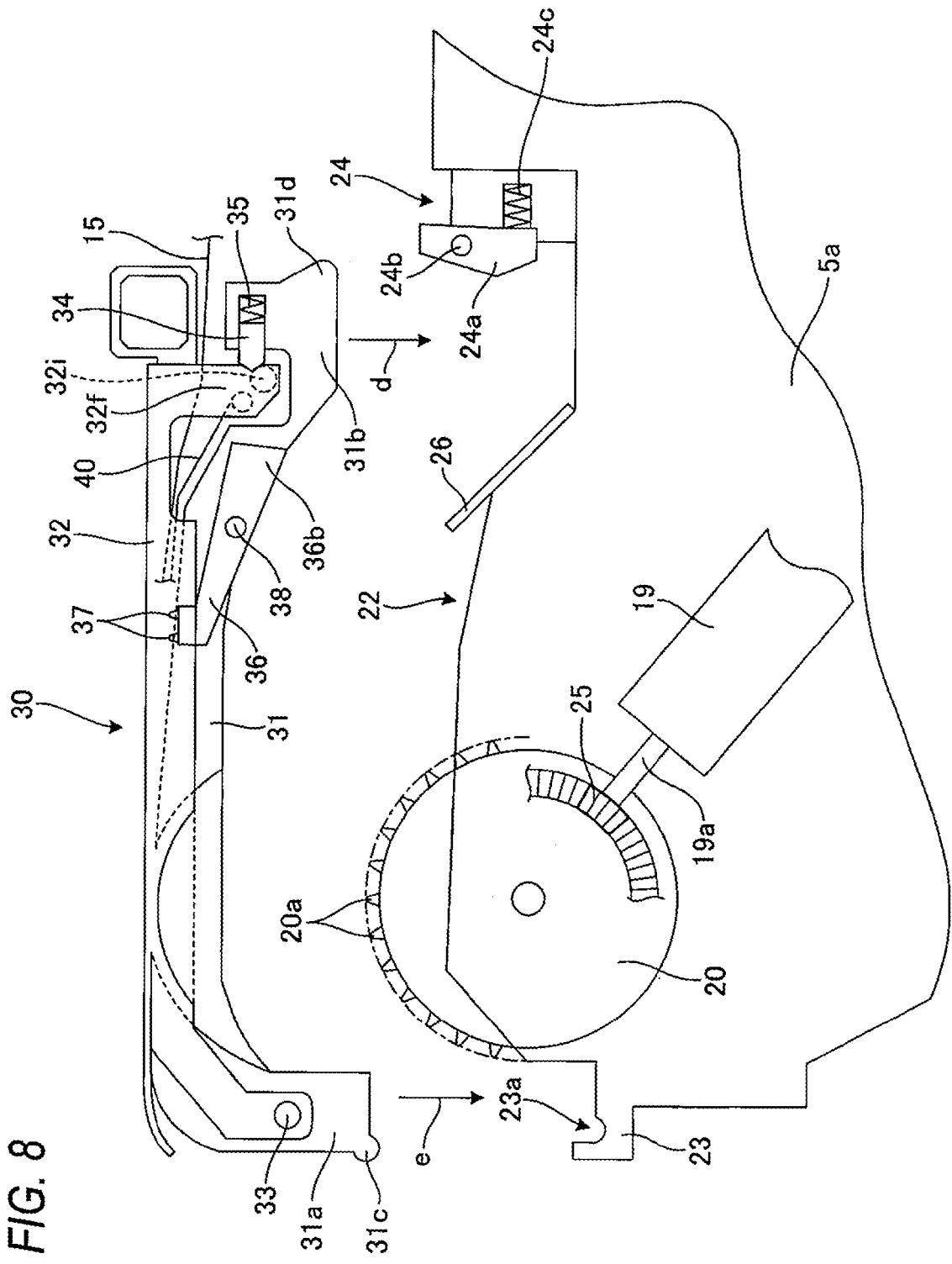
FIG. 8 is a view illustrating a function of the guide section that is mounted on the tape feeder according to the embodiment of the invention.

FIG. 8 shows an operation for mounting the guide section 30, of which the upper member 32 is closed to the lower member 31 in this way, on the guide mounting portion 22. In this mounting work, while the downstream mounting portion 31*a* is aligned with the downstream fitting portion 23 and the upstream mounting portion 31*b* is aligned with the upstream locking section 24, the downstream mounting portion 31*a* is moved down (arrow d) first so that the fitting portion 31*c* is fitted into the fitting recess 23*a* and the upstream mounting portion 31*b* is then moved down (arrow e) so that the locked portion 31*d* is locked by the locking member 24*a*. At this time, it is preferable that the alignment pins more accurately determining the positions of the downstream mounting portion 31*a* and the upstream mounting portion 31*b* be formed on the downstream fitting portion 23 and the upstream locking section 24 and be fitted to fitting holes formed at the downstream mounting portion 31*a* and the upstream mounting portion 31*b*. Further, in this state, the leaf spring member 26 provided on the guide mounting portion 22 comes into contact with the opposite end portion 36*b* opposite to the pin mounting portion 36*a* from below and applies an external force for releasing the fitting of the alignment pins 37 to the opposite end portion 36*b*. Accordingly, the alignment pins 37 retreat from the upper surface of the tape support portion 31*e*.

Figure 9:
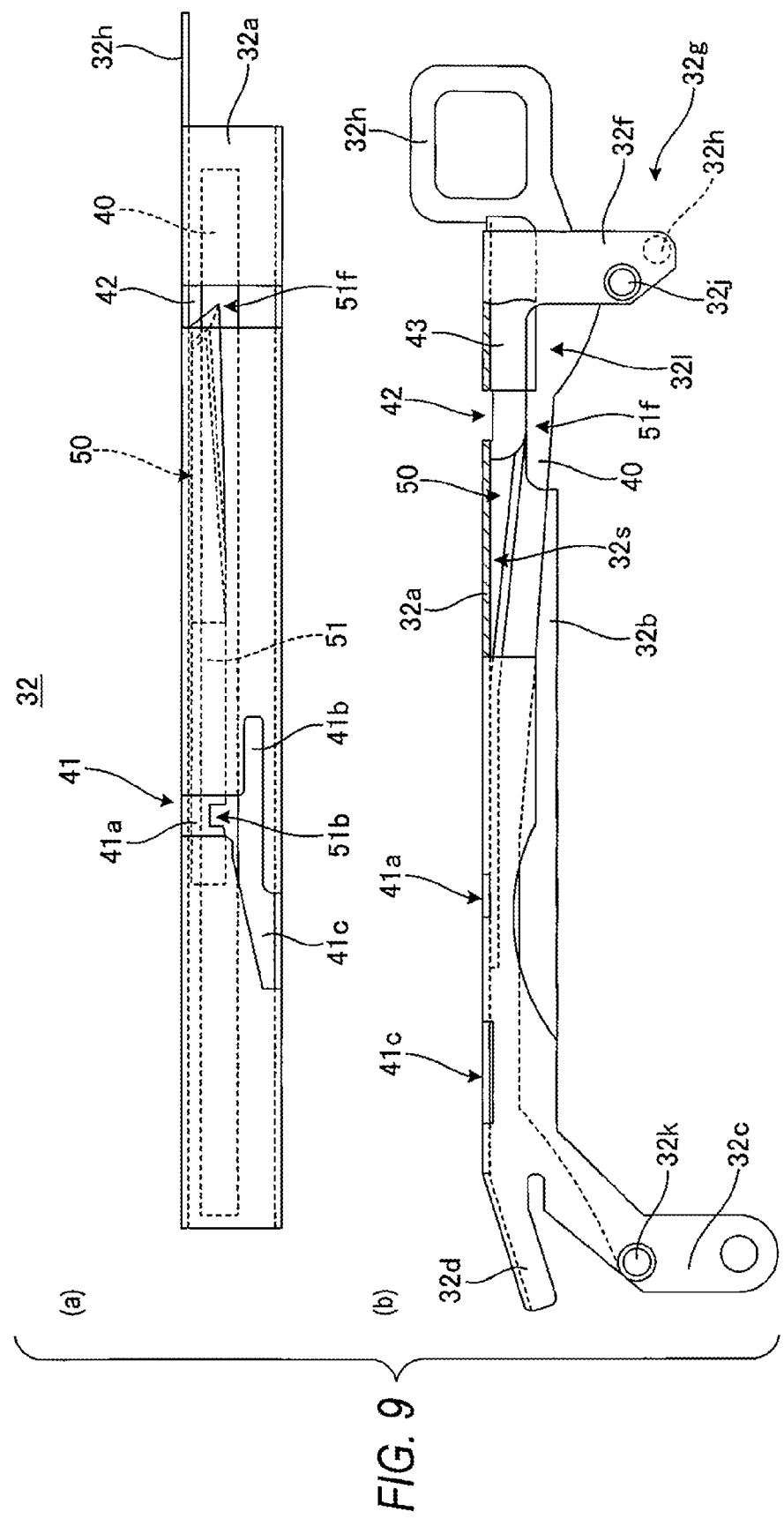
FIGS. 9A and 9B are views illustrating the configuration of an upper member of the guide section that is mounted on the tape feeder according to the embodiment of the invention.
Figure 10:
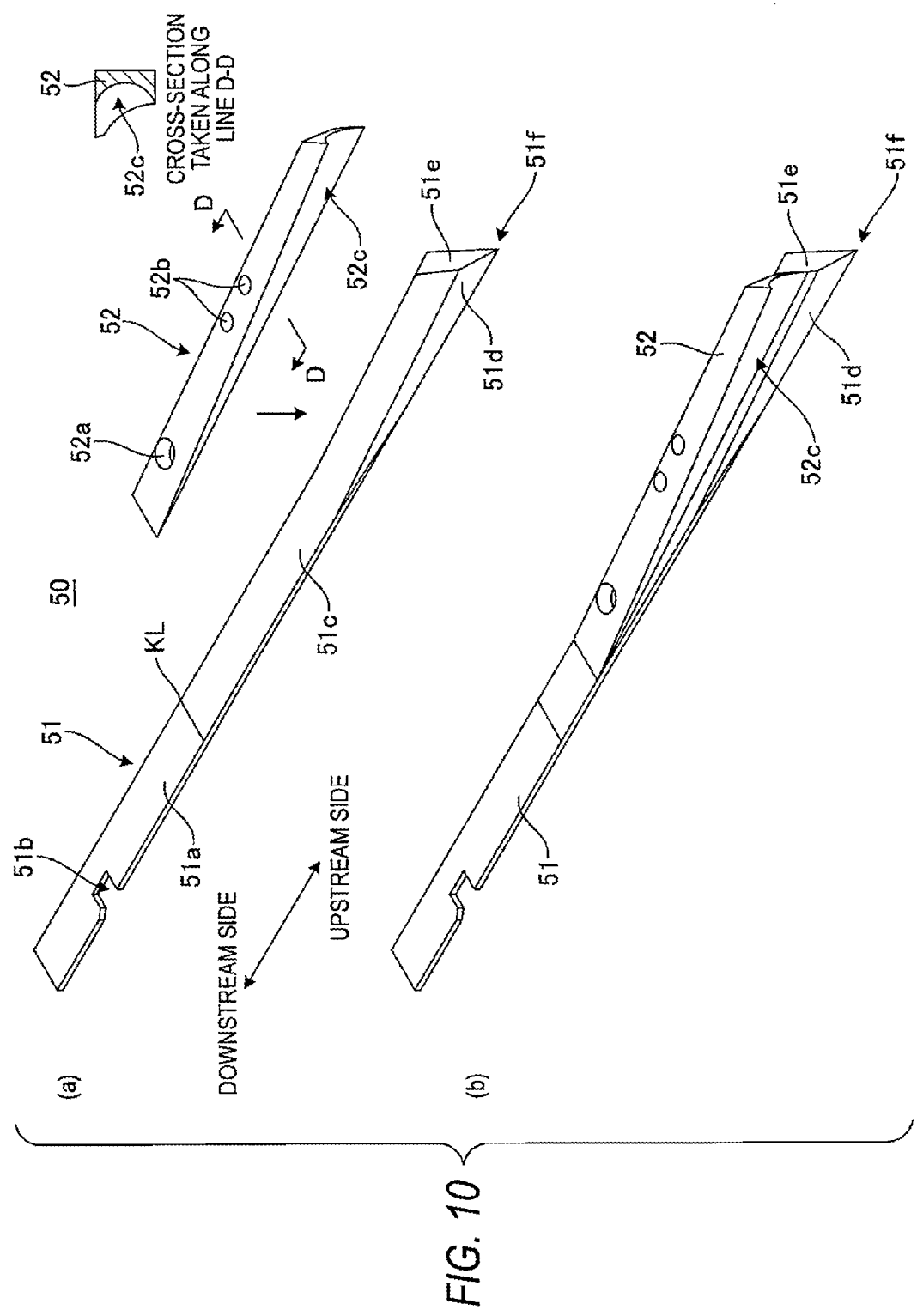
FIGS. 10A and 10B are views illustrating the shape of separating members of a tape separating mechanism that are assembled in the guide section of the tape feeder according to the embodiment of the invention.
Figure 11:
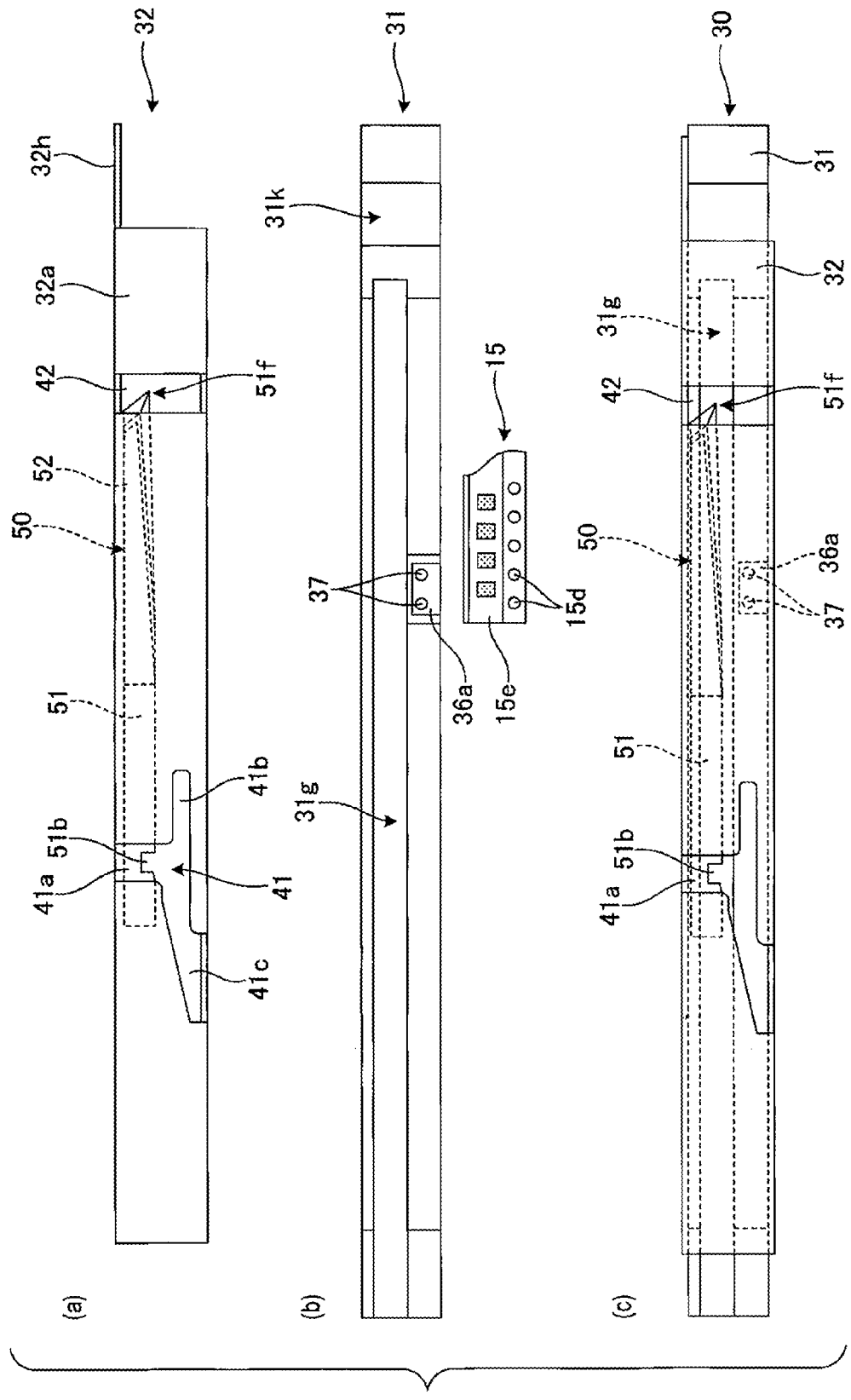
FIGS. 11A to 11C are views illustrating the disposition of the tape separating mechanism that is assembled in the guide section of the tape feeder according to the embodiment of the invention.

Next, the configuration of a cover tape separating mechanism 50 provided on the upper member 32 of the guide section 30 will be described with reference to FIGS. 9A to 11C. FIG. 9A is a plan view of the upper member 32, and a first opening portion 41 and a second opening portion 42 are formed on the upper surface portion 32*a*. The first opening portion 41 includes a component take-out opening 41*a* through which the electronic component 16 held on the carrier tape 15 is picked up by the suction nozzles 8*a*, a pin escape opening 41b that avoids the interference between the feed pins 20a of the sprocket 20 and the upper surface portion 32a, and a tape escape opening 41c that prevents the cover tape 15e from being caught by the component take-out opening 41a at the time of the tape separation to be described below. The second opening portion 42 is used as a check opening portion through which a separation state is visually checked when the cover tape 15e is separated from the carrier tape 15 by the cover tape separating mechanism 50 to be described below.

As shown in FIG. 9B, the cover tape separating mechanism 50 is provided on the guide surface 32s that is the back surface of the upper surface portion 32a of the upper member 32. The cover tape separating mechanism 50 has a function of exposing the electronic components 16, which are stored in the component pockets 15b, to the outside by separating the cover tape 15e from one side portion of the base tape 15a of the carrier tape 15 on which the component pockets 15b are formed (see FIGS. 13A to 13E). That is, the cover tape separating mechanism 50 separates the adhering surface from one side portion in a separation target range R (see FIG. 13E), which includes at least the component pockets 15b, by being interposed between the base tape 15a and the adhering surface of the cover tape 15e during the pitch-feeding of the carrier tape 15. The cover tape separating mechanism 50 includes first and second separating members 51 and 52 to be described below.

Further, as described in detail in the description of the operation to be described below, the cover tape separating mechanism 50 folds the cover tape 15e on the base tape 15a in a flat shape at a pick-up position by bending one side portion of the cover tape 15e, which is separated from the base tape 15a by the first and second separating members 51 and 52, toward the other side portion and pressing the bent cover tape 15e against the guide surface 32s of the upper member 32 from below while guiding the carrier tape 15 to the pick-up position.

The tape separation is started when the carrier tape 15 introduced from the tape insertion opening 32g reaches the upstream end portion of the cover tape separating mechanism 50. However, at this time, in order to make a separating blade edge 51f, which is formed at the end portion of the cover tape separating mechanism 50, reliably penetrate the adhering surface between the base tape 15a and the cover tape 15e, a cutout portion 32l is formed in a predetermined range of the surface portions 32b corresponding to the vicinity of the separating blade edge 51f. The cutout portion 32l is provided for the operation for reliably aligning the adhering surface of the carrier tape 15, which is inserted from the tape insertion opening 32g, with the cover tape separating mechanism 50 by the lower guide member 40. That is, due to the cutout portion 32l, a push-up operation can be performed by a worker's finger or the lower guide member 40 can be lifted by a mechanical push-up mechanism provided on the upper member 32.

As shown in FIGS. 10A and 10B, the cover tape separating mechanism 50 is formed so that a second separating member 52 formed by working a metal rod is superimposed on the upper surface of a first separating member 51 formed by working a metal plate. The first separating member 51 is a long thin plate member having a bent portion KL thereon, and downstream and upstream portions of the bent portion KL form a horizontal portion 51a and an inclined portion 51c, respectively. A component take-out portion 51b through which an electronic component 16 is taken out is formed at the horizontal portion 51a. A side end blade edge 51d and a front end blade edge 51e, which are worked into the shape of a tapered blade edge, are formed at an upstream side end portion and an upstream end portion of the inclined portion 51c, respectively. The intersection between the side end blade edge 51d and the front end blade edge 51e forms a sharp separating blade edge 51f. As described below, the separating blade edge 51f penetrates the adhering surface between the base tape 15a and the cover tape 15e while the tape is separated.

The second separating member 52 is a rod-like member that has a bottom shape corresponding to the upper surface of the inclined portion 51c of the first separating member 51. As shown in the cross-section taken along line D-D, a concave conical surface 52c having a tapered shape such as an internal conical surface, of which the radius of curvature is gradually reduced toward the downstream side, is formed on the side surface of the second separating member 52. A positioning hole 52a and mounting screw holes 52b, which are used to mount the second separating member on the upper member 32, are formed on the upper surface of the second separating member 52. The concave conical surface 52c functions as a bending operation surface that bends the cover tape 15e in a folding direction by coming into contact with the cover tape 15e that is separated by the separating blade edge 51f and fed to the downstream side.

The cover tape separating mechanism 50 is formed so that the bottom of the second separating member 52 and the inclined portion 51c of the first separating member 51 come into contact with each other and are fixed to each other by a joining method such as brazing. In this state, the horizontal portion 51a and the upper surface of the second separating member 52 form the same surface, the front end blade edge 51e and the separating blade edge 51f protrude toward the upstream side from the end portion of the second separating member 52, and the side end blade edge 51d protrudes from the side of the second separating member 52.

When the cover tape separating mechanism 50 is mounted on the upper member 32, the positioning hole 52a and the mounting screw holes 52b are aligned with the upper member 32 and fixing bolts are threadably fastened to the mounting screw holes 52b through the upper surface portion 32a. Accordingly, the cover tape separating mechanism 50 is fixed and mounted to the upper member 32. In this state, as shown in FIG. 11A, the component take-out portion 51b corresponds to the component take-out opening 41a of the upper surface portion 32a and the separating blade edge 51f is positioned below the second opening portion 42. Further, in a mounting state where the upper member 32 is closed to the lower member 31 as shown in FIG. 11B, the separating blade edge 51f of the cover tape separating mechanism 50 is positioned above the groove portion 31g of the lower member 31 as shown in FIG. 11C.

Accordingly, the cover tape separating mechanism 50 is positioned adjacent to the positioning mechanism for the carrier tape 15, that is, the alignment pins 37 on which the pin mounting portion 36a is provided, in the width direction of the carrier tape 15. The positioning mechanism and the cover tape separating mechanism 50 are provided at non-interference positions that do not interfere with each other. Since the cover tape separating mechanism 50 and the positioning mechanism are disposed as described above, the increase of the size of the guide section 30 in the longitudinal direction is prevented. Accordingly, it is possible to realize a compact guide section 30.

Figure 12:
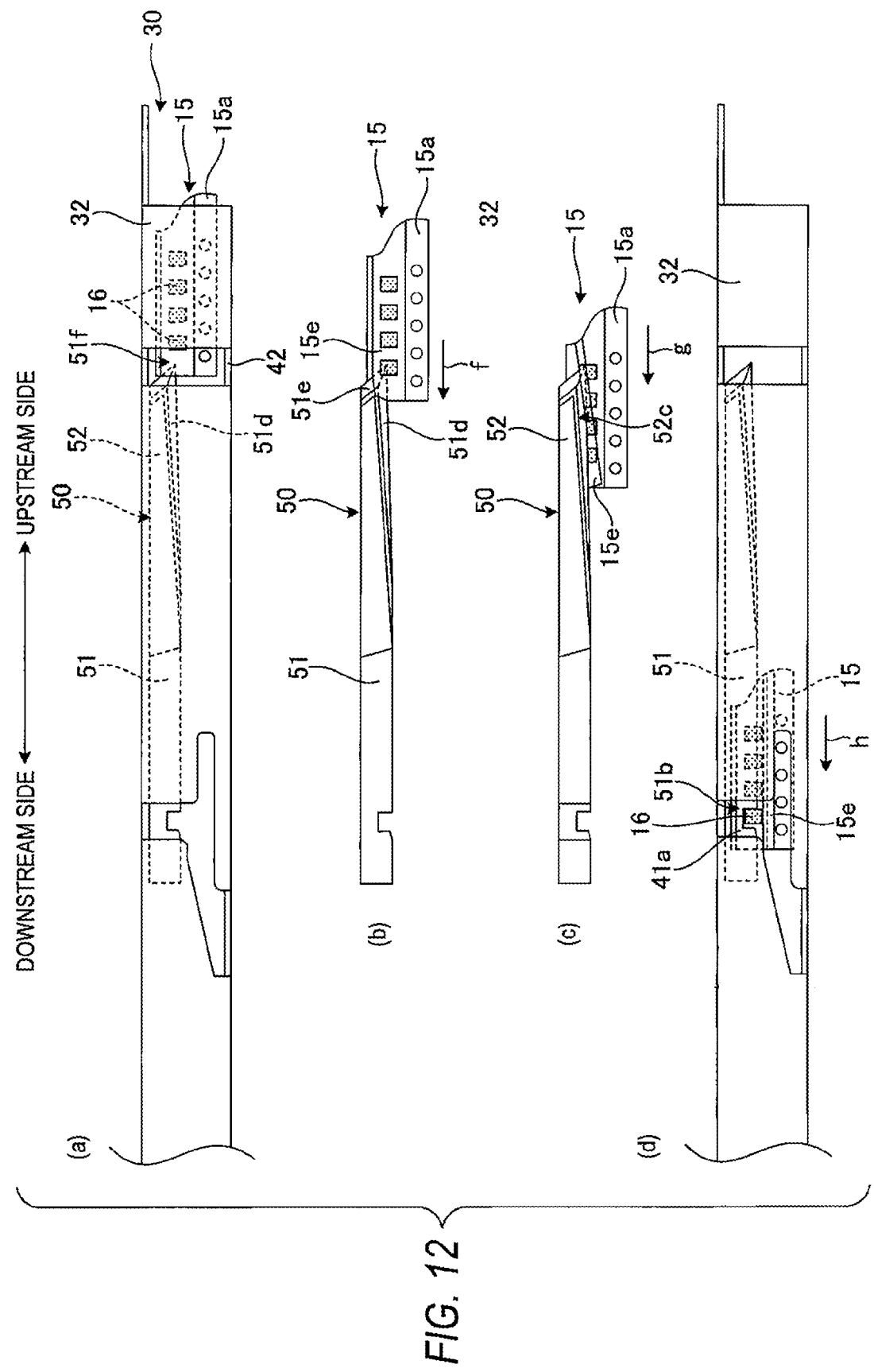
FIGS. 12A to 12D are views illustrating a tape separating operation of the tape feeder according to the embodiment of the invention.
Figure 13:
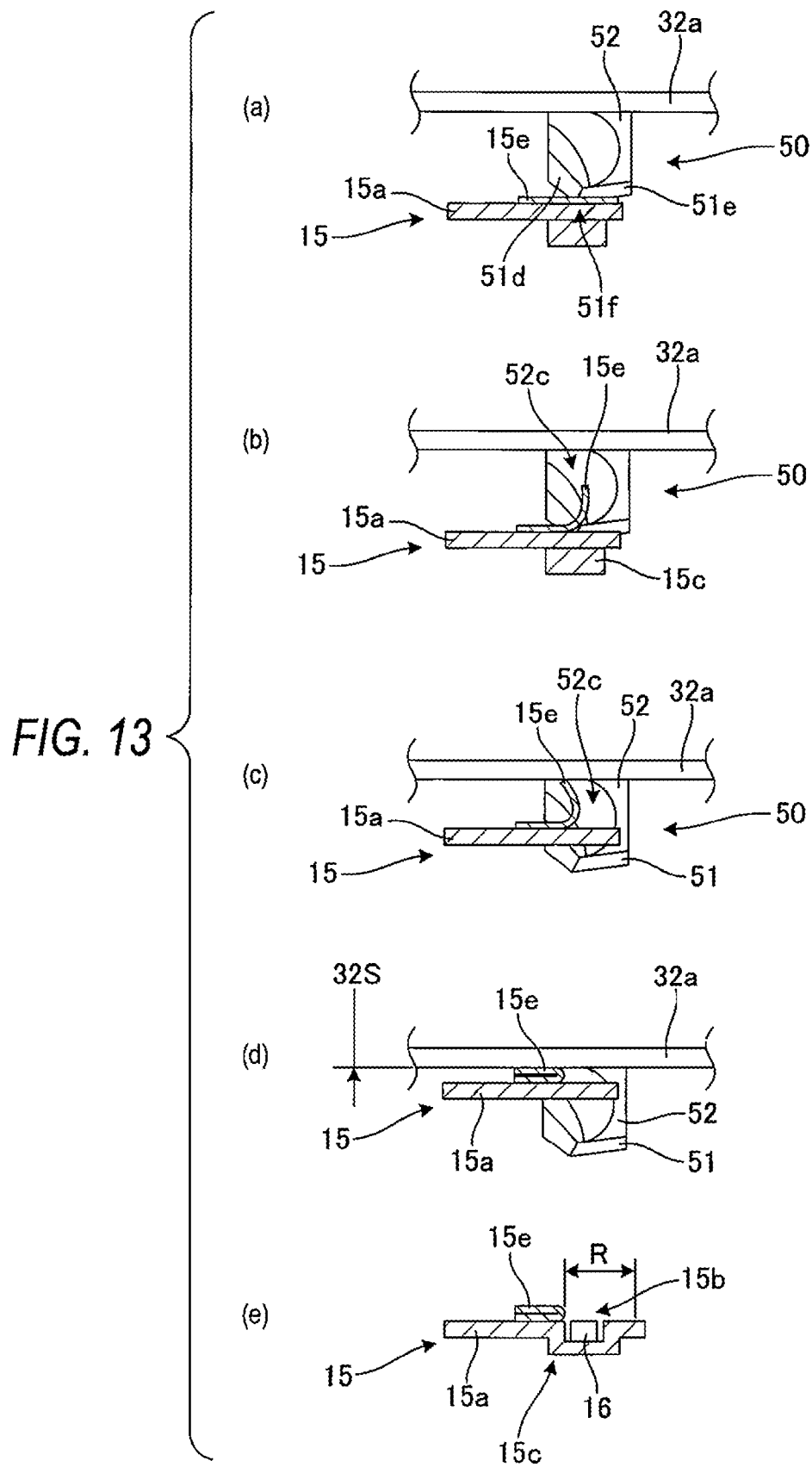
FIGS. 13A to 13E are views illustrating the tape separating operation of the tape feeder according to the embodiment of the invention.

Next, a process for separating the cover tape 15e by the cover tape separating mechanism 50 will be described with reference to FIGS. 12A to 13E. FIG. 12A shows a state where the end of the carrier tape 15 inserted from the tape insertion opening 32g reaches the separating blade edge 51f of the cover tape separating mechanism 50 and can be visually recognized from the second opening portion 42 in the guide section 30 of which the upper member 32 is opened (see FIG. 7). In this state, the carrier tape 15 is lifted from below by the lower guide member 40 and the separating blade edge 51f penetrates the adhering surface between the base tape 15a and the cover tape 15e as shown in FIG. 13A. Accordingly, the tape separation is started.

That is, when the carrier tape 15 is fed to the downstream side (arrow f) as shown in FIG. 12B, the cover tape separating mechanism 50 and the carrier tape 15 are moved relative to each other in the state where the side end blade edge 51d and the front end blade edge 51e formed on both sides of the separating blade edge 51f are interposed between the base tape 15a and the adhering surface of the cover tape 15e. Accordingly, as shown in FIG. 13B, the cover tape 15e is separated from one side portion (right side portion in FIG. 13B) of the base tape 15a on which the component pockets 15b are formed. Further, the cover tape 15e, which is separated and partially rises from the base tape 15a, comes into contact with the concave conical surface 52c and is bent toward the other side portion (left side portion in FIG. 13C) opposite to the one side portion due to a bending action caused by the shape of the concave conical surface 52c. Furthermore, when the carrier tape 15 is further fed (arrow g) as shown in FIG. 12C, the separation range of the cover tape 15e is enlarged along the blade edge range of the side end blade edge 51d. Together with this, as shown in FIG. 13C, the carrier tape 15 is moved up while being pushed up along the inclined lower surface of the first separating member 51 by the lower guide member 40, so that the base tape 15a is moved up. The separated cover tape 15e is pushed up along the concave conical surface 52c having a tapered shape due to the upward movement of the base tape, so that the bending degree of the cover tape 15e is increased.

Moreover, when the carrier tape 15 is further fed (arrow h) and the electronic component 16, that is, an object to be sucked reaches the component take-out opening 41a corresponding to the pick-up position as shown in FIG. 12D, the carrier tape 15 becomes close to the guide surface 32s of the upper surface portion 32a. Accordingly, the cover tape 15e of which the bending degree has been gradually increased is pressed against the guide surface 32s from below as shown in FIG. 13D, so that the cover tape 15e is folded on the base tape 15a in a flat shape. In this state, the electronic component 16, which has reached the position of the component take-out portion 51b in the component take-out opening 41a, is completely separated as shown in FIG. 13E in the separation target range R that is set so as to include the component pocket 15b. Accordingly, the electronic component 16 is exposed to the upper surface.

Further, the suction nozzles 8a (see FIG. 3) perform a pick-up operation on the electronic component 16 exposed in this way, so that the electronic component 16 is vacuum-sucked and taken out. Since the cover tape 15e is folded in a flat shape, it is possible to set the lifting strokes of the suction nozzles 8a, which are required for the pick-up operation, to a short distance in this pick-up operation as compared to the related art where a pick-up operation is performed while the separated cover tape 15e rises. Accordingly, it is possible to prevent a trouble caused by the increase of a lifting stroke, for example, the deterioration of component-suction accuracy that is caused by the shift of the horizontal position occurring during the lifting of nozzles due to the nozzle-mounting accuracy.

The cover tape separating mechanism 50, which is provided on the guide section 30 shown in this embodiment, includes the first and second separating members 51 and 52 that separate the adhering surface from one side portion in the separation target range R, which includes at least recesses, by being interposed between the base tape 15a and the adhering surface of the cover tape 15e during the pitch-feeding of the carrier tape 15. Moreover, the cover tape separating mechanism 50 folds the cover tape 15e on the base tape 15a in the flat shape at the pick-up position by bending one side portion of the cover tape 15e, which is separated from the base tape 15a by the first and second separating members 51 and 52, toward the other side portion and pressing the bent cover tape 15e against the guide surface 32s of the upper member 32 from below while guiding the carrier tape 15 to the component take-out opening 41a corresponding to the pick-up position.

That is, the first and second separating members 51 and 52 forming the cover tape separating mechanism 50 include the separating blade edge 51f that is formed to be sharp at the upstream end portion in a pitch feed direction and penetrates the adhering surface between the base tape 15a and the cover tape 15e, and the concave conical surface 52c that is tapered toward the pick-up position and functions as a bending operation surface bending the cover tape 15e in a folding direction by coming into contact with the cover tape 15e, which is separated by the separating blade edge 51f and pitch-fed to the downstream side.

In this tape separation, as described above, the cover tape separating mechanism 50 is positioned adjacent to the positioning mechanism for the carrier tape 15, which includes the pin mounting portion 36a and the alignment pins 37, in the width direction of the carrier tape 15. Accordingly, when the cover tape 15e is separated from the base tape 15a, the carrier tape 15 is positioned in the horizontal direction by the positioning mechanism. That is, since it is possible to reliably fix the base tape 15a, of which the position is apt to be unstable after the separation of the cover tape 15e, by the alignment pins 37, it is possible to easily and accurately align the carrier tape 15 with the guide section 30.

Figure 14:
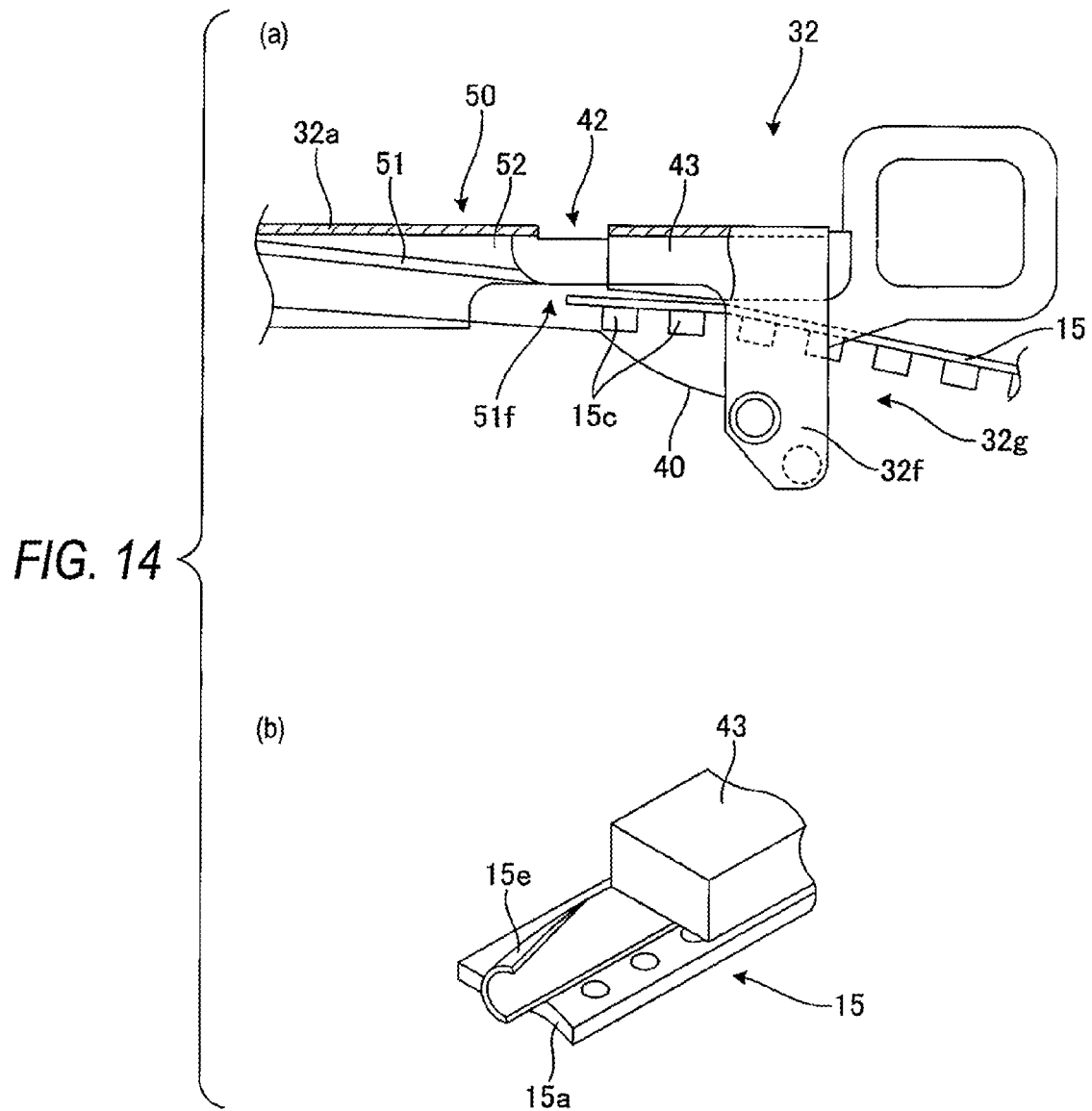
FIGS. 14A and 14B are views illustrating the configuration and function of a separation suppressing mechanism of the tape separating mechanism of the tape feeder according to the embodiment of the invention.

Next, the configuration and function of a separation suppressing mechanism, which is provided on the upstream side of the cover tape separating mechanism 50 in the upper member 32 of the guide section 30 and suppresses the separation of the cover tape 15e from the base tape 15a not yet reaching the cover tape separating mechanism 50, will be described with reference to FIGS. 14A and 14B. As shown in FIG. 14A, a block-shaped pressing member 43 is provided on the upstream side (right side in FIG. 14A) of the second opening portion 42 on the back surface of the upper surface portion 32a. The pressing member 43 is positioned on the upstream side of the separating blade edge 51f with a predetermined interval (for example, about one pitch of the components) between the pressing member 43 and the separating blade edge 51f, and the lower surface of the pressing member 43 substantially corresponds to the height position of the separating blade edge 51f.

When the carrier tape 15 is to be mounted on the upper member 32, the lower surface of the carrier tape 15 introduced from the tape insertion opening 32g is guided by the lower guide member 40 and the carrier tape 15 is fed while the upper surface (the cover tape 15e) of the carrier tape 15 is pressed by the pressing member 43. That is, the carrier tape 15 is pushed up by a resilient force of the lower guide member 40 made of a leaf spring or the like, so that the carrier tape 15 comes into press contact with the lower surface of the pressing member 43. Meanwhile, if the resilient force of the lower guide member 40 is insufficient, the lower guide member 40 is pushed up through the push-up that is performed by a worker's finger, or by push-up means formed of other auxiliary mechanisms.

Accordingly, the carrier tape 15 is fed while the upper surface of the carrier tape 15 is pressed by the pressing member 43, and tape separation is performed through the processes described with reference to FIGS. 12A to 13E. At this time, as shown in FIG. 14B, the cover tape 15e of the upper surface of the carrier tape 15 is pressed from below by the pressing member 43 that is positioned on the upstream side of the separating blade edge 51f with a predetermined interval between the pressing member 43 and the separating blade edge 51f. Accordingly, the separation of the cover tape 15e from the base tape 15a is suppressed in a range where the cover tape comes into contact with the pressing member 43. Therefore, the falling-off of the electronic components 16, which is caused by the separation of the cover tape 15e and the opening of the component pockets 15b, is prevented. That is, the pressing member 43 functions as a separation suppressing mechanism that suppresses the separation of the cover tape 15e from the base tape 15a, which does not yet reach the cover tape separating mechanism 50, by pressing the cover tape 15e from above.

In addition, a worker can visually check the alignment between the separating blade edge 51f and the carrier tape 15 through the second opening portion 42 that is formed at the upper member 32. That is, the second opening portion 42, which is formed at the upper member 32 between the cover tape separating mechanism 50 and 43 as a separation suppressing mechanism, functions as a check opening portion which is formed by partially removing the upper surface of the upper member 32 and through which a worker visually checks the state of the separation of the cover tape performed by the cover tape separating mechanism.

Figure 15:
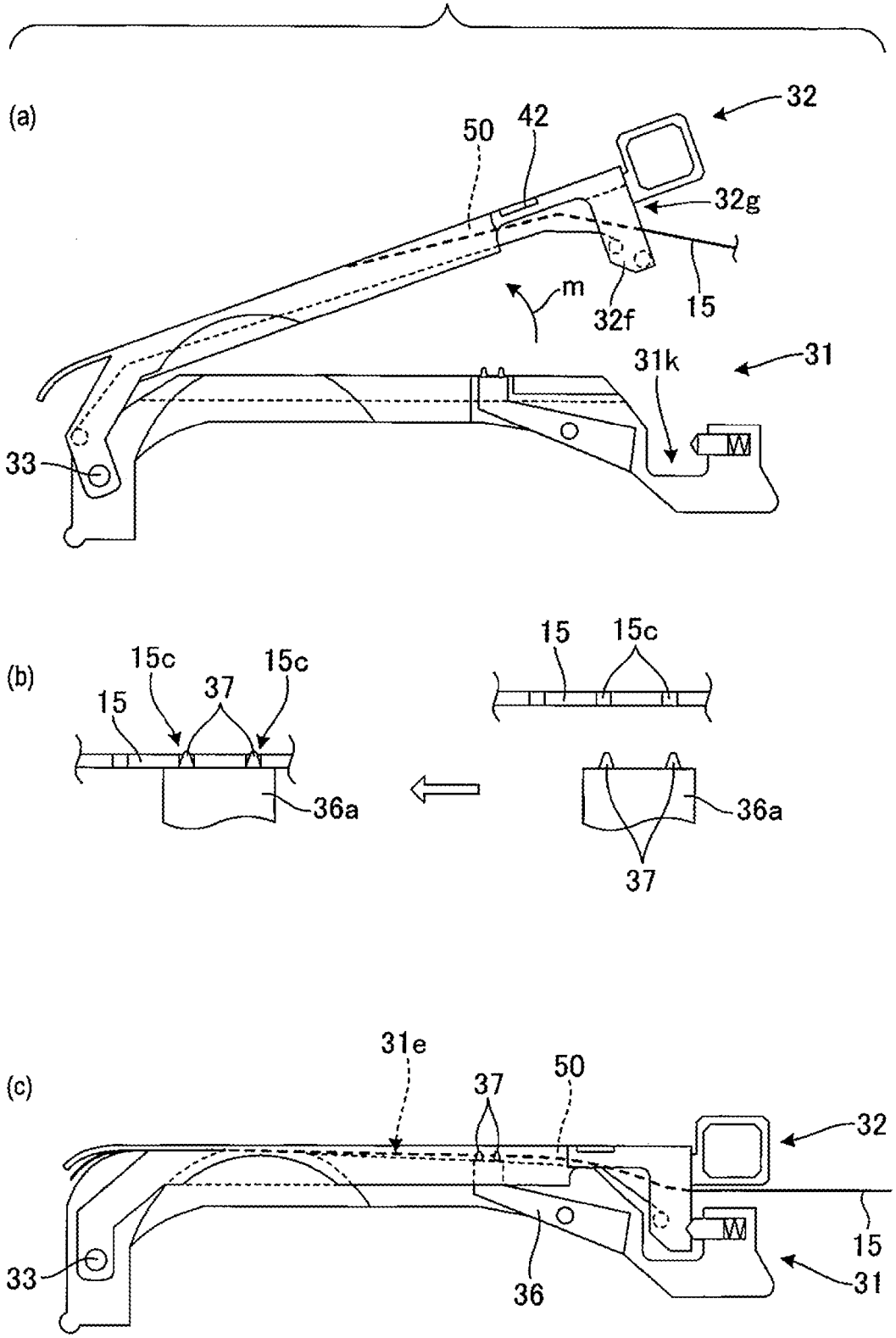
FIGS. 15A to 15C are views illustrating processes of a method of mounting a tape on a tape feeder according to an embodiment of the invention.

Next, a method of mounting on a new carrier tape 15 on the tape feeder 5 will be described with reference to FIGS. 15A to 16B. First, the carrier tape 15 is introduced into the upper member 32 from the tape insertion opening 32g in the state where the guide section 30 is detached from the body portion 5a (tape introducing process). This work is performed in the state where the bent portions 32f are drawn out from the locking recess 31k and the upper member 32 is turned relative to the lower member 31 (arrow m) so as to open the guide section 30 as shown in FIG. 15A.

In this tape introducing process, when the carrier tape 15 is mounted in the upper member 32, the separating blade edge 51f, which is formed to be sharp at the upstream end portion of the first separating member 51 in the pitch feed direction, pushes up the carrier tape 15, which is an object to be mounted, together with the lower guide member 40 from below at a separation start position where the separation of the adhering surface is started. Accordingly, at the separation start position, the separating blade edge 51f is aligned with and penetrates the adhering surface.

After that, the carrier tape 15 is fed to the downstream side from the separation start position, so that the tape separation performed by the cover tape separating mechanism 50 is performed. That is, when the carrier tape 15 is introduced into the upper member 32, the cover tape 15e separated from the base tape 15a by the first separating member 51 is bent from one side portion of the component pocket 15b toward the other side portion of the component pocket as shown in FIGS. 13A to 13E. Further, while the carrier tape 15 is guided to the component take-out opening 41a formed corresponding to the pick-up position, the bent cover tape 15e is pressed against the guide surface 32s of the upper member 32 from below.

Accordingly, the cover tape 15e is folded on the base tape 15a in a flat shape at the pick-up position.

Further, in this tape separation, the carrier tape 15 is pressed from above by the pressing member 43 provided on the upstream side of the cover tape separating mechanism 50. Accordingly, the separation of the cover tape 15e from the base tape 15a, which does not yet reach the cover tape separating mechanism 50, is suppressed. Therefore, a trouble, such as component standing where the electronic component 16 stands up in the component pocket 15b or component falling where the electronic component 16 falls off from the opened component pocket 15b, is prevented. Further, in the processes subsequent to the tape introducing process, a worker visually checks the state of the separation of the cover tape 15e, which is performed by the cover tape separating mechanism 50, through the second opening portion 42 that is a check opening portion formed between the cover tape separating mechanism 50 and the pressing member 43 by partially removing the upper surface of the upper member 32. Accordingly, it is possible to prevent a defect by monitoring the occurrence of a trouble such as separation failure.

Then, the alignment pins 37 are fitted to the feed holes 15d of the introduced carrier tape 15, so that the relative positions of the carrier tape 15 and the guide section 30 in the tape feed direction are aligned with each other (alignment process). That is, while the position of the carrier tape 15 is adjusted so that the positions of the feed holes 15d correspond to the alignment pins 37 as shown in FIG. 15B, the upper member 32 is closed to the lower member 31. Accordingly, the alignment pins 37 are fitted to the feed holes 15d.

After that, as shown in FIG. 15C, the upper member 32 is closed to the lower member 31. At this time, since the positioning mechanism, which includes the alignment pin 37 and the pin mounting portion 36a, and the cover tape separating mechanism 50 are disposed as shown in FIGS. 11B and 11C, it is possible to make the lower member 31 be integrated with the upper member 32 without the interference between the positioning mechanism and the cover tape separating mechanism 50. Accordingly, a new carrier tape 15, of which the leading portion is separated by the cover tape separating mechanism 50 and has been completely subjected to a heading-out work, is correctly positioned in the tape feed direction and set in the guide section 30 that is integrated in the vertical direction. The mounting of the carrier tape 15 on the guide mounting portion 22 is performed in this state.

That is, as shown in FIG. 16A, the guide section 30 on which the carrier tape 15 is mounted is aligned with, mounted on, and fixed to the guide mounting portion 22 (guide section fixing process). In the guide section fixing process, while the downstream mounting portion 31a is aligned with the downstream fitting portion 23 and the upstream mounting portion 31b is aligned with the upstream locking section 24 as shown in FIG. 8, the downstream mounting portion 31a is moved down (arrow n) first and the upstream mounting portion 31b is then moved down (arrow o). FIG. 16B shows a state where the guide section fixing process has been completed in this way. That is, the fitting portion 31c is fitted to the fitting recess 23a of the downstream fitting portion 23 and the locked portion 31d is locked by the locking member 24a of the upstream locking section 24, so that the guide section 30 is fixed to the guide mounting portion 22. Accordingly, the leaf spring member 26 comes into contact with the pin mounting portion 36a, so that the alignment pins 37 retreat downward and are separated from the feed holes 15d of the carrier tape 15. Therefore, the positioning is released, so that the carrier tape 15 is fed. In addition to this, the feed pins 20a of the sprocket 20 are engaged with the feed holes 15d of the carrier tape 15, so that the carrier tape 15 can be pitch-fed.

As described above, when the carrier tape 15 is introduced into the guide section 30, the tape feeder 5 shown in this embodiment folds the cover tape 15e on the base tape 15a in the flat shape at the pick-up position by bending one side portion of the cover tape 15e, which is separated from the base tape 15a by the cover tape separating mechanism 50, toward the other side portion and pressing the bent cover tape 15e against the guide surface 32s of the guide section 30 from below while guiding the carrier tape 15 to the pick-up position. Accordingly, it is possible to set the lifting strokes of the suction nozzles 8a, which are required for the pick-up operation, to a short distance, and to prevent the deterioration of component-suction accuracy that is caused by the shift of the horizontal positions of the suction nozzles 8a occurring due to the increase of the lifting strokes.

Further, in the configuration where the cover tape separating mechanism 50 partially separating the cover tape 15e from the carrier tape 15 is provided in the guide section 30, the separation suppressing mechanism, which suppresses the separation of the cover tape 15e from the base tape 15a not yet reaching the cover tape separating mechanism 50, is provided in the guide section 30 on the upstream side of the cover tape separating mechanism 50. Accordingly, it is possible to prevent a trouble such as component standing or component falling caused by the early separation of the cover tape 15e.

Furthermore, the positioning mechanism that determines the relative positions of the carrier tape 15 and the guide section 30 on the lower member 31 in the tape feed direction, and the cover tape separating mechanism 50 that is provided on the upper member 32 and exposes the electronic components 16 stored in the component pockets 15b by separating the cover tape 15e from the base tape 15a are provided at the non-interference positions that do not interfere with each other when the upper member 32 is closed to the lower member 31. Accordingly, when the cover tape 15e is separated from the carrier tape 15, it is possible to easily and accurately align the carrier tape 15 with the guide section 30.

The invention has been described in detail with reference to specific embodiments, but it is apparent for those skilled in the art that the invention may have various modifications or alterations without departing from the spirit and scope of the invention.

This application is based on Japanese Patent Application (Japanese Patent Application No. 2011-024922) filed on Feb. 8, 2011, the entire contents of which being incorporated herein by reference.

INDUSTRIAL APPLICABILITY

A tape feeder and a method of mounting a tape on a tape feeder according to the invention have configuration where separating members partially separating a cover tape from a carrier tape are provided in a tape guide, have an effect of being capable of ensuring component-suction accuracy, and are useful in a component-mounting field where electronic components are taken out from tape feeders and mounted on a substrate.

REFERENCE SIGNS LIST

1: component mounting device
3: substrate
4: component supply unit
5: tape feeder
5a: body portion
5d: tape travel path
8: transfer head
15: carrier tape
15b: component pocket
15d: feed hole
15e: cover tape
16: electronic component
17: tape feed section
19: feed motor
20: sprocket
20a: feed pin
22: guide mounting portion
23: downstream fitting portion
24: upstream locking section
30: guide section
31: lower member
31a: downstream mounting portion
31b: upstream mounting portion
31c: fitting portion
31d: locked portion
31e: tape support portion
32: upper member
32a: upper surface portion
32b: side surface portion
32c: pivot plate
32g: tape insertion opening
32l: cutout portion
32s: guide surface
33: pivot pin
34: locking member
36: alignment member
37: alignment pin
38: pivot pin
40: lower guide member
41: first opening portion
42: second opening portion
43: pressing member
50: cover tape separating mechanism
51: first separating member
51f: separating blade edge
52: second separating member
52c: concave conical surface (bending operation surface)
R: separation target range

The invention claimed is:

1. A tape feeder that sequentially supplies electronic components to a pick-up position where the electronic component is picked up by a transfer head by pitch-feeding a carrier tape that holds the electronic component in component storage recesses, the tape feeder comprising:

a body portion in which a tape travel path guiding the carrier tape is formed, the carrier tape including a base tape on which the recesses are formed and a cover tape adhering to an upper surface of the base tape so as to cover the recesses;

a tape feed mechanism that is provided in the body portion and pitch-feeds the carrier tape at a predetermined pitch by intermittently rotating a sprocket when feed pins of the sprocket are engaged with feed holes formed on the base tape; and a guide section that guides the carrier tape fed by the tape feed mechanism in a predetermined range including the pick-up position on the body portion, and is detachably mounted on the body portion, wherein the guide section includes a lower member that guides a lower surface of the carrier tape and is provided with an attachment/detachment mechanism that is attached to and detached from the body portion, an upper member that guides the width direction of the carrier tape and presses the carrier tape from above by a guide surface to guide the upper surface of the carrier tape, and an opening and closing mechanism that opens and closes the upper member with respect to the lower member, a positioning mechanism that determines the relative positions of the carrier tape and the guide section on the lower member in a tape feed direction by fitting alignment pins to feed holes of the carrier tape, and a cover tape separating mechanism that is provided on the upper member, and exposes the electronic components stored in the recesses by separating the cover tape from one side portion of the base tape on which the recesses are formed, and the positioning mechanism and the cover tape separating mechanism are provided at non-interference positions that do not interfere with each other when the upper member is closed to the lower member.

2. The tape feeder according to claim 1, wherein the non-interference positions are positions where the positioning mechanism and the cover tape separating mechanism are adjacent to each other in the width direction of the carrier tape.

3. A method of mounting a carrier tape on a guide section of a tape feeder, the tape feeder including a body portion in which a tape travel path guiding the carrier tape is formed, the carrier tape including a base tape on which the recesses are formed and a cover tape adhering to an upper surface of the base tape so as to cover the recesses, a tape feed mechanism that is provided in the body portion and pitch-feeds the carrier tape at a predetermined pitch by intermittently rotating a sprocket when feed pins of the sprocket are engaged with feed holes formed on the base tape, and a guide section that guides the carrier tape fed by the tape feed mechanism in a predetermined range including the pick-up position on the body portion, and is detachably mounted on the body portion, the guide section including a lower member that guides a lower surface of the carrier tape and is provided with an attachment/detachment mechanism that is attached to and detached from the body portion, an upper member that guides the width direction of the carrier tape and presses the carrier tape from above by a guide surface to guide the upper surface of the carrier tape, an opening and closing mechanism that opens and closes the upper member with respect to the lower member, a positioning mechanism that determines the relative positions of the carrier tape and the guide section on the lower member in a tape feed direction by fitting alignment pins to feed holes of the carrier tape, and a cover tape separating mechanism that is provided on the upper member, and exposes the electronic components stored in the recesses by separating the cover tape from one side portion of the base tape on which the recesses are formed, and the tape feeder sequentially supplying the exposed electronic components to a pick-up position where the electronic component is picked up by a transfer head by pitch-feeding the carrier tape that holds the electronic component in the recesses, the method comprising:

separating one side portion of the cover tape from the base tape of the introduced carrier tape by the cover tape separating mechanism and folding one side portion of the cover tape toward the other side portion when the carrier tape is introduced into the upper member; and closing the upper member to the lower member so that the positioning mechanism and the cover tape separating mechanism do not interfere with each other.

\* \* \* \* \*